United States Patent
Chen et al.

(10) Patent No.: US 6,313,710 B1
(45) Date of Patent: Nov. 6, 2001

(54) INTERACTION STRUCTURE WITH INTEGRAL COUPLING AND BUNCHING SECTION

(76) Inventors: Liming Chen; Hezhong Guo, both of 9208 Van Fleet Ct., Laurel, MD (US) 20708; Han Y. Chen, F3, 18 Alley 17, Lane 839, Fu Shing Rd., Hsinchu (TW); Ming H. Tsao, F4, 17 Alley 94, Lane 21, Wen Fu Street, Lei Fu District, Taipei (TW); Tze T. Yang, F14, 35-1 Tian Mei Street, Sec 3, Hsinchu (TW); Yi C. Tsai, 58-6 Lungkang, Tungshih County Chayi (TW); Kwo R. Chu, 48-1 West Yuan National Tsing Hua University, Hsinchu (TW)

( * ) Notice: Subject to any disclaimer, the term of this patent is extended or adjusted under 35 U.S.C. 154(b) by 0 days.

(21) Appl. No.: 09/567,573

(22) Filed: May 4, 2000

(30) Foreign Application Priority Data

May 20, 1999 (TW) ............................................ 88208123 U

(51) Int. Cl.[7] .............................. H03B 9/04; H01J 25/10
(52) U.S. Cl. .......................... 331/83; 315/5.44; 315/5.46; 315/5.52
(58) Field of Search ................................. 331/81, 82, 83; 315/5.39, 5.44, 5.46, 5.52, 5.53

(56) References Cited

U.S. PATENT DOCUMENTS 3,684,913 * 8/1972 James et al. ........................... 315/3.5
4,209,755 * 6/1980 Busacca et al. ....................... 331/83

OTHER PUBLICATIONS

Chodorow et al., "High–Efficiency Klystron with Distributed Interaction", IRE Trans. Electron Devices, Jan. 1961, pp. 44–55.

Ginzton, "Generation of Laboratory Signals", Microwave Measurements, 1957, pp. 1–53, McGraw–Hill Book Co., New York.

Gilmour, "Hybrid Tubes", Microwave Tubes, 1986, pp. 315–323, Ch. 11, Artech House, Norwood, MA.

Staprans et al, "High–Power Linear–Beam Tubes", Proc. IEEE, Mar. 1973, pp. 299–330, vol. 61, No. 3.

* cited by examiner

Primary Examiner—Siegfried H. Grimm
(74) Attorney, Agent, or Firm—Marc Bobys

(57) ABSTRACT

The interaction structure with integral coupling and bunching section and method of use of the present invention produces backward wave oscillations in an RF structure which combines ballistic bunching and extended beam-wave interaction in a complex resonator assembly. The complex extended interaction structure includes a five-gap electromagnetically-coupled cavity structure with a coaxial section inserted between the first and second cavities. The first cavity serves as a buncher cavity while the four subsequent cavities serve as energy cavities. In the coaxial section, beam and wave propagate in separate channels. The field in the buncher cavity is coupled to the four subsequent energy extraction cavities through the wave channel between the inner and outer conductors of the coaxial section, while the electron beam drifts along a cylindrical channel cut through the inner conductor of the coaxial section. The complex extended interaction structure of the present invention provides a drift channel (cutoff to the wave) to allow ballistic bunching of electrons. Since the buncher cavity is strongly coupled to the energy extraction cavities, the first gap exerts a large modulating voltage on the electrons, sufficient to produce a tightly bunched electron beam upon entrance into the energy extraction cavities.

20 Claims, 22 Drawing Sheets

INTERACTION STRUCTURE WITH INTEGRAL COUPLING AND BUNCHING SECTION

This application claims foreign priority benefits of Taiwan Patent Application number 88208123 filed on May 20, 1999, the disclosure of which is hereby incorporated by reference in its entirety into the present disclosure.

BACKGROUND OF THE INVENTION

Extended interaction structures of the prior art have several cavities of the doubly re-entrant type with electromagnetic fields strongly coupled by slots in the walls (see A. S. Gilmore, Jr., "Microwave Tubes", Artech House, Norwood, Mass., 1986, Ch. 11, A. Staprans, E. W. McCune, and J. A. Ruetz, "High-Power Linear-Beam Tubes", Proc. IEEE, vol. 61, pp 299–330, 1973; M. Chodorow and T. Wessel-Berg, "High-Efficiency Klystron with Distributed Interaction", IRE Trans. Electron Devices, pp. 44–55, 1961). The electrons interact with the RF field at the interaction gap of each cavity. When the electron velocity is synchronized with the gap fields, its energy can be extracted at a multiple number of gaps. For a given total gap voltage, distributed interaction in an N-gap structure proportionally reduces the field level in the cavities as compared to that of a single gap structure, thus increasing the power handling capability by a factor up to $N^2$. Tubes based on the extended interaction structure, such as the extended interaction oscillator (EIO) and extended interaction klystron (EIK), are often the choice for high average power operation, especially in the millimeter wave band. For example, EIOs are capable of kilowatt continuous wave (CW) power output in the Ku-band and hundreds of watts CW in the Ka-band. They are available, with reduced power, at much higher frequencies up to 260 GHz. Additional advantages of the extended interaction structure include a high gain-bandwidth product due to its larger resistance to quality (R/Q) value.

The extended interaction structure, on the other hand, does not by itself yield high efficiency. In linear electron tubes such as the klystron or EIK, ballistic bunching of electrons provides one of the most effective means for efficient beam-wave interaction. Conversion efficiencies in excess of 70% have been achieved in klystrons.

New applications, such as ceramic sintering and materials processing, are emerging which require moderately high power millimeter wave sources. These needs (for example, several kilowatts CW) are beyond the capability of state-of-the-art EIOs, which has motivated the development of gyrotrons for such applications. However, the gyrotron technology involves a complicated electron gun configuration and a bulky magnetic/power supply system. To fulfill the requirements of such moderate power applications, it is therefore desirable to provide a device having a greater interaction efficiency and increased power handling capability than does the EIO, but without the high cost and bulkiness of gyrotrons.

SUMMARY OF THE INVENTION

The interaction structure with integral coupling and bunching section of the present invention results in a moderately high-power source which is relatively economical and compact. The interaction structure produces backward wave oscillations in an RF structure which combines ballistic bunching and extended beam-wave interaction in a complex resonator assembly. The complex extended interaction structure includes a five gap electromagnetically-coupled cavity structure with a coaxial section inserted between the first and second cavities. The first cavity serves as a buncher cavity while the four subsequent cavities serve as energy extraction cavities. In the coaxial section, beam and wave propagate in separate channels. The field in the buncher cavity is coupled to the four subsequent energy extraction cavities through the wave channel between the inner and outer conductors of the coaxial section, while the electron beam drifts along a cylindrical channel cut through the inner conductor of the coaxial section. As compared to a conventional extended interaction structure, the complex extended interaction structure of the present invention provides a drift channel (cutoff to the wave) to allow ballistic bunching of electrons. Since the buncher cavity is strongly coupled to the energy extraction cavities, the first gap exerts a large modulating voltage on the electrons, sufficient to produce a tightly bunched electron beam upon entrance into the energy extraction cavities.

To realize the advantages outlined above, the interaction structure for producing electromagnetic radiation having an integral coupling and bunching section, comprises a first cavity for electromagnetically interacting with an electron beam; a second cavity having a second gap for electromagnetically interacting with the electron beam; an inner conductor and an outer conductor forming the integral coupling and bunching section; a wave channel passing between the inner and outer conductors of the integral coupling and bunching section, the wave channel for electromagnetically coupling the first and second cavities through coupling slots in walls of the first and second cavities; and a beam bunching channel passing through the inner conductor of the integral coupling and bunching section, the radius of the beam bunching channel smaller than a cutoff radius to provide a region essentially free of electromagnetic fields within the beam bunching channel, the beam bunching channel having a length for providing ballistic bunching of the electron beam between the first and second cavities.

Also, to realize the advantages outlined above, the method for generating electromagnetic radiation using an oscillator based on an interaction structure having an integral coupling and bunching section, comprises the steps of generating an electron beam; modulating the velocity of the electron beam by passing the electron beam across a first gap of a first cavity so that the electron beam interacts electromagnetically with the first cavity; ballistically bunching the electron beam by passing the electron beam through an integral coupling and bunching section having an inner conductor and an outer conductor, the electron beam passing through a beam bunching channel passing through the inner conductor, the radius of the beam bunching channel smaller than a cutoff radius to provide a region essentially free of electromagnetic fields within the beam bunching channel, the beam bunching channel having a length for providing ballistic bunching of the electron beam; driving a gap voltage across a second gap of a second cavity by passing the electron beam through the second cavity so that the electron beam interacts electromagnetically with the second cavity; and providing feedback between the first and second cavities by electromagnetically coupling the first and second cavities through coupling slots in walls of the first and second cavities, the coupling slots connected by a wave channel passing between the inner and outer conductors.

To further realize the advantages outlined above, an oscillator based on an interaction structure having an integral coupling and bunching section producing backward wave oscillations comprises: an electron beam generated by an electron gun; A first doubly re-entrant cavity having a gap disposed so that the electron beam passes across the gap, the gap having a gap voltage which modulates the electron beam; a cascade of electromagnetically coupled doubly re-entrant energy extraction cavities having gaps disposed so that the electron beam passes across the gaps and transfers energy from the electron beam to the electromagnetic fields in the cascade of electromagnetically coupled doubly re-entrant energy extraction cavities; a coaxial waveguide section having an inner conductor and an outer conductor forming the integral coupling and bunching section; a wave channel passing between the inner and outer conductors of the coaxial waveguide section, the wave channel electromagnetically coupling the first doubly re-entrant cavity with the cascade of electromagnetically coupled doubly re-entrant energy extraction cavities through coupling slots in walls of the cavities and providing feedback from the cascade of electromagnetically coupled doubly re-entrant energy cavities to the first doubly re-entrant cavity; a tuner installed in the coaxial waveguide, the tuner having a portion adjustably extending into the wave channel and interacting with electromagnetic fields in the wave channel to tune the resonant frequency of the interaction structure and create a feedback condition so that the oscillator oscillates and the cascade of electromagnetically coupled doubly re-entrant energy extraction cavities drive the first doubly re-entrant cavity; the cascade of electromagnetically coupled doubly re-entrant energy extraction cavities having a second doubly re-entrant energy extraction cavity attaching the coaxial waveguide section to the cascade of electromagnetically coupled doubly re-entrant energy extraction cavities, the second doubly re-entrant cavity having a second gap disposed so that the electron beam passes across the second gap, the electron beam driving a gap voltage across the second gap; a beam bunching channel passing through the inner conductor of the integral coupling and bunching section and through which the electron beam passes, the radius of the beam bunching channel smaller than a cutoff radius, thus providing a region essentially free of electromagnetic fields within the beam bunching channel, the beam bunching along the length of the beam bunching channel and achieving a substantially optimized alternating current beam current at the second gap; an output window coupled to the cascade of electromagnetically coupled doubly re-entrant energy extraction cavities for extracting electromagnetically radiation from the oscillator; and a collector for collecting the electron beam after the electron beam has passed through the interaction structure.

DETAILED DESCRIPTION OF THE PREFERRED EMBODIMENTS

Figure 1:
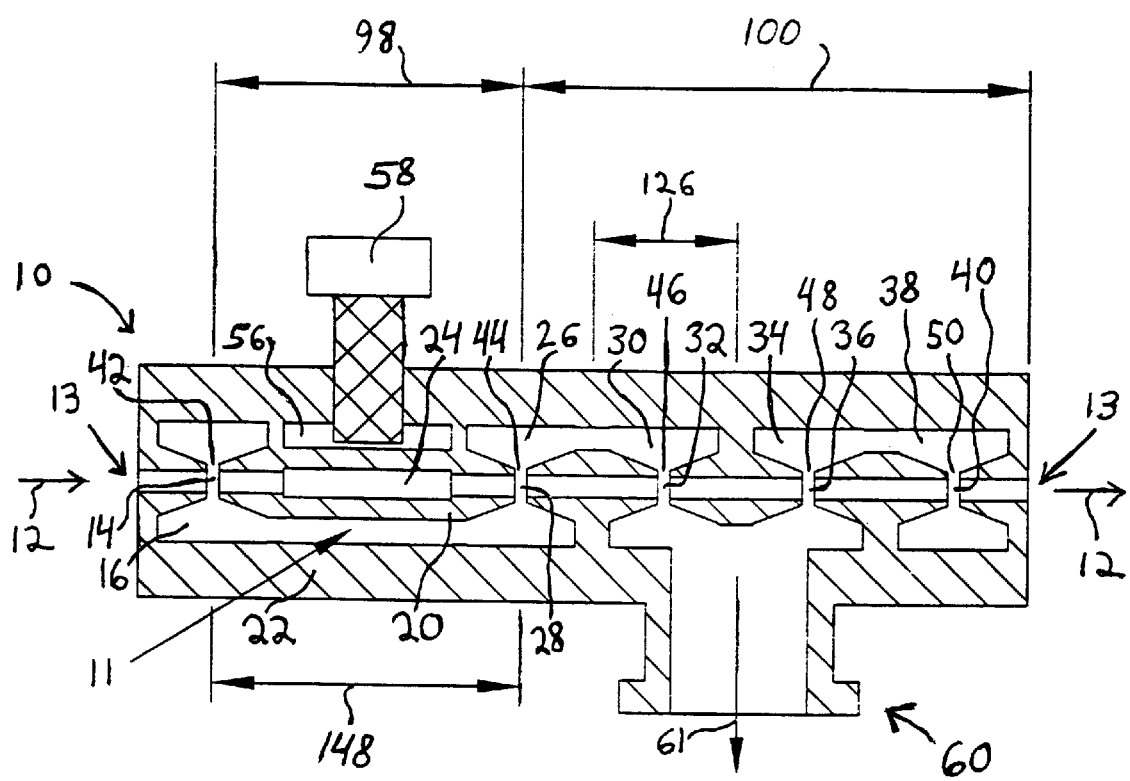
FIG. 1 is a diagrammatic vertical cross-sectional vies of the interaction structure with integral coupling and bunching section according to one embodiment of the present invention.

Although detailed illustrative embodiments are disclosed herein, other suitable structures and machines for practicing the invention may be employed and will be apparent to persons of ordinary skill in the art. Consequently, specific structural and functional details disclosed herein are representative only; they describe the preferred embodiments of the invention. In the following detailed description, like reference numerals will be used to refer to like or corresponding elements in the different figures of the drawings.

Referring to FIG. 1, there is shown a complex extended interaction structure 10 with integral coupling and bunching section according to one embodiment of the present invention. In one embodiment the integral coupling and bunching section can be a coaxial waveguide section 11. A coaxial waveguide is one having an inner conductor and an outer conductor. An electron beam 12 traverses the interaction structure through an electron beam channel 13. The electron beam 12 enters the interaction structure 10 and passes across a first gap 14 of a first doubly re-entrant buncher cavity 16. A doubly re-entrant cavity is one in which two sets of metallic boundaries extending into its interior. The electron beam 12 then passes through the coaxial waveguide section 11. The coaxial waveguide section 11 has an inner conductor 20 and an outer conductor 22. The electron beam 12 passes through a beam bunching channel 24 passing through the inner conductor 20. The beam then passes through a cascade of electromagnetically coupled doubly re-entrant energy extraction cavities. The cascade of doubly re-entrant extraction cavities is comprised of a second cavity 26 having a second gap 28, a third cavity 30 having a third gap 32, a fourth cavity 34 having a fourth gap 36 and a fifth cavity 38 having a fifth gap 40. The electron beam 12 leaves the interaction structure 10 after passing across the fifth gap 40.

Figure 13:
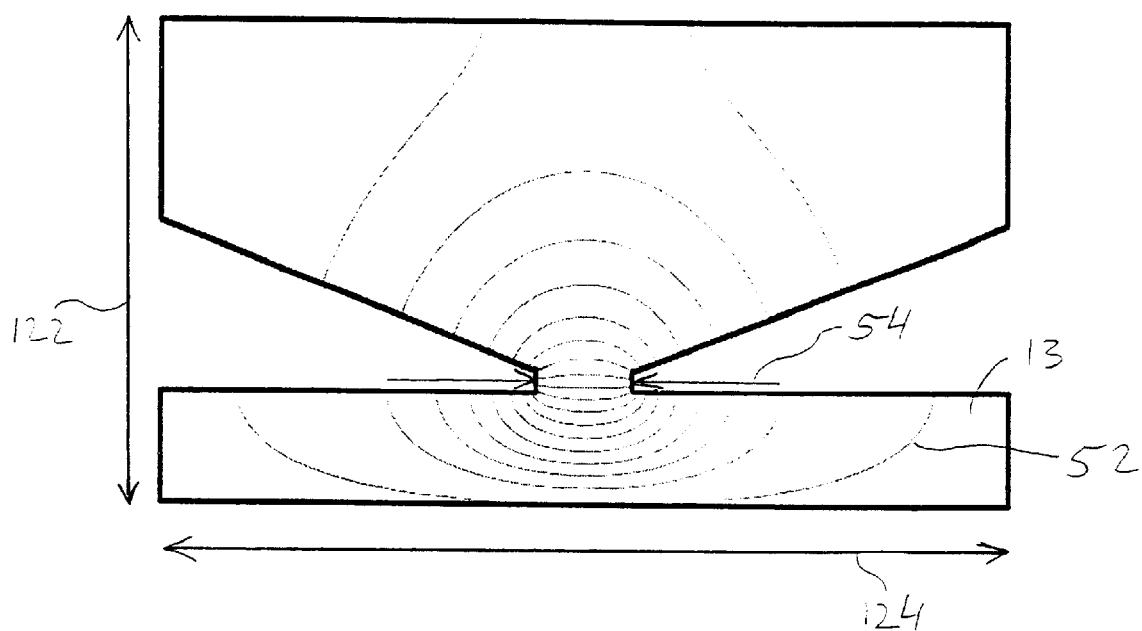
FIG. 13 shows a diagrammatic view of the electric field lines in one of the interaction structure cavities illustrated in FIGS. 1–4.

The cavities 16, 26, 30, 34, 38 resonate, creating gap voltages 42, 44, 46, 48, 50 across the gaps 14, 28, 32, 36, 40, respectively. FIG. 13 shows the shape of one of the cavities of the interaction structure 10 along with a computer simulation showing electric field lines 52. A gap voltage across the gap 54 generates the electric field lines 52 flowing from the cavity into the electron beam channel 13. Returning to FIG. 1, the electric fields of the buncher cavity 16 cause velocity modulation of the electron beam 12. The velocity modulation of the electric beam 12 causes bunching of the electron beam 12 as it drifts through the substantially field-free beam bunching channel 24. The bunched electron beam 12 then transfers energy to the electric fields of the cascade of energy extraction cavities 26, 30, 34, 38. The electromagnetic energy 61 is extracted from the interaction structure through an output window 60 of electromagnetically coupled to the cascade of energy extraction cavities 26, 30, 34, 38. Each of the energy extraction cavities 26, 30, 34, 38, is coupled to the following cavity through coupling slots in the walls of the cavities. The cascade of energy extraction cavities 26, 30, 34, 38 is coupled to and provides feedback to the buncher cavity 16 through a wave channel 56 passing between the inner 20 and outer 22 conductors of the coaxial waveguide section 11. A tuner 58 can be installed in the coaxial waveguide section 11. The tuner 58 has a portion adjustably extending into the wave channel 56 and serves to tune the resonant frequency of the interaction structure 10, creating a feedback condition so that the cavities will oscillate.

The interaction structure of the present invention has characteristics similar to those of a periodically loaded waveguide. The axial profile of the wave function in a periodically loaded waveguide is periodically distorted by the wall loading, resulting in an infinite number of spatial Fourier components. All components have the same group velocity, but different phase velocities. A stack of coupled cavities terminated by conducting plates at both ends results in a field that is the superposition of two propagating waves of equal amplitude and oppositely directed group velocity. The two propagating waves form a standing wave corresponding to an integer multiple of a half guide wavelength along the structure. A resonator with "N" cavities has a total of "N" cavity resonances and "N-1" coupling slot resonances.

Figure 14A:
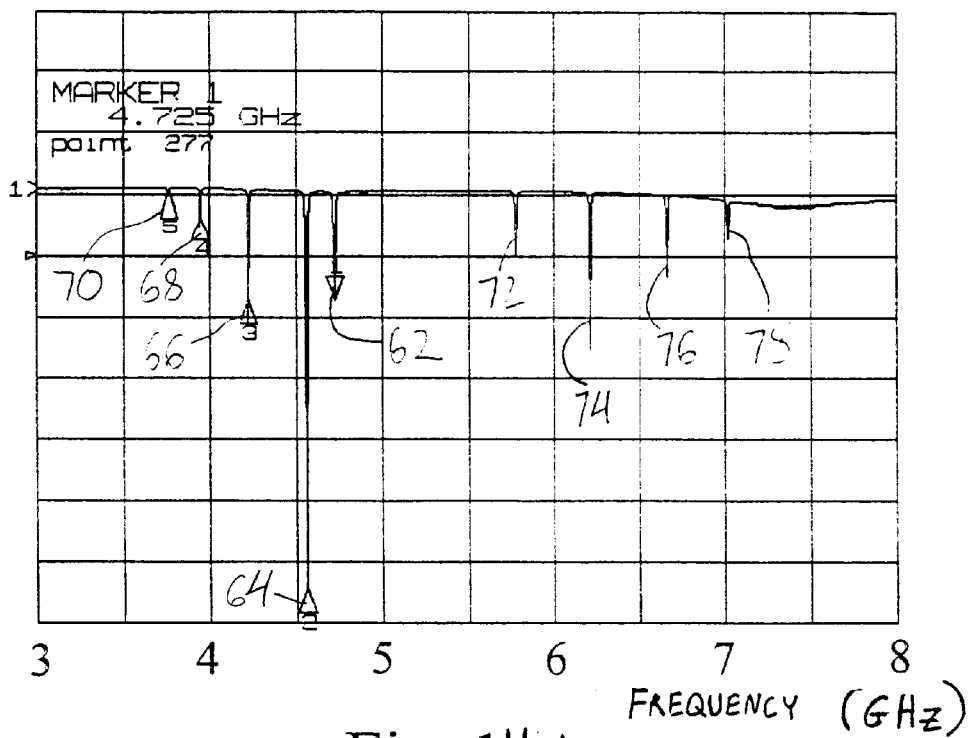
FIG. 14A shows a graph of cavity and slot resonance frequencies of a C-band cold test model having five cavities and four slots coupling the cavities, but without the coaxial section.
Figure 14B:
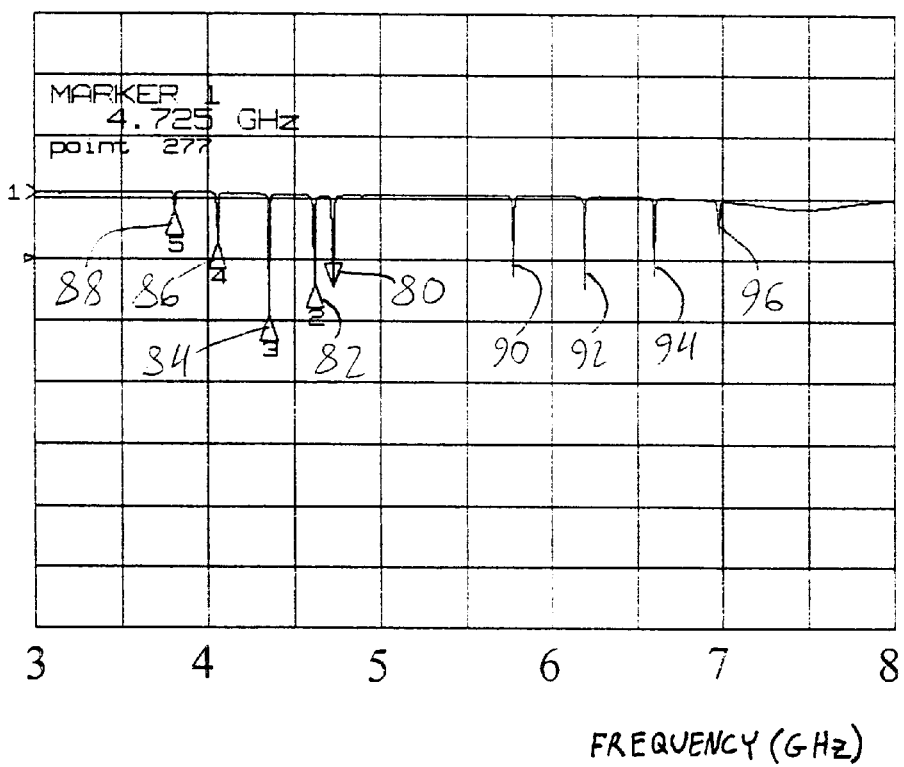
FIG. 14B shows a graph of cavity and slot resonance frequencies of a C-band cold test model having five cavities, four slots coupling the cavities and a coaxial section separating the first and second cavities.

Cold test models (no electron beam) were built in the C-band to compare the properties of the complex extended interaction structure of the present invention to that of an interaction structure without the integral coupling and bunching section. Each of the models has five cavities and four slots coupling the cavities to each other. The models do not include the tuner 58 or the output window 60. FIG. 14A shows a graph of the cavity and slot resonance frequencies of the model without the integral coupling and bunching section. The resonances of the cavities are shown at 62, 64, 66, 68, 70 and the resonances of the slots are shown at 72, 74, 76, 78: FIG. 14B shows a graph of the cavity and slot resonance frequencies of the model having the integral coupling and bunching section separating the first and second cavities. The resonances of the cavities are shown at 80, 82, 84, 86, 88 and the resonances of the slots are shown at 90, 92, 94, 96. Thus "N" cavity resonances and "N-1" coupling slot resonances are shown in the graphs. The length of the wave channel separating the first and second cavities is approximately a half wavelength of the "$2\pi$" or "$0\pi$" cavity mode (indicated at 62, 80 in FIGS. 13A and 13B, respectively). Consequently, the resonant frequency of the $2\pi$ cavity remains substantially unchanged, as shown by 62, 80 in FIGS. 13A and 13B, respectively, while those of the other cavity resonances are modified by the addition of the integral coupling and bunching section.

Figure 15A:
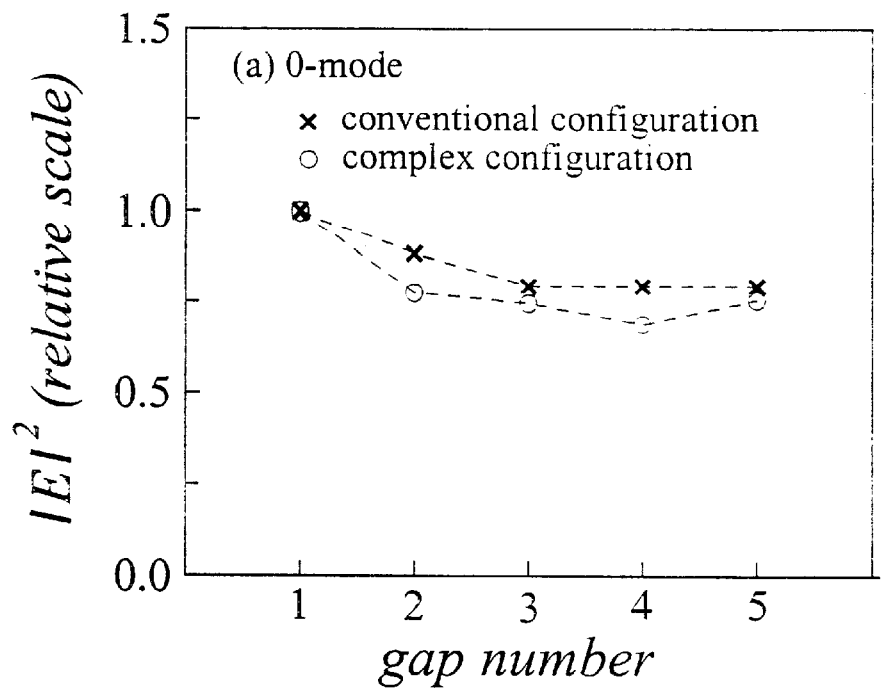
FIG. 15A shows a graph of the relative field strengths for the $2\pi$ cavity resonance at the five gap positions of C-band cold test models both with and without the coaxial section.

FIG. 15A is a graph showing the relative field strengths for the $2\pi$ cavity resonance at the five doubly re-entrant cavity gap positions of the C-band cold test models both with the integral coupling and bunching section (illustrated by "o" in the figure") and without the integral coupling and bunching section (illustrated by "x" in the figure"). Each of the models exhibit very similar gap voltage profiles for this mode.

Figure 15B:
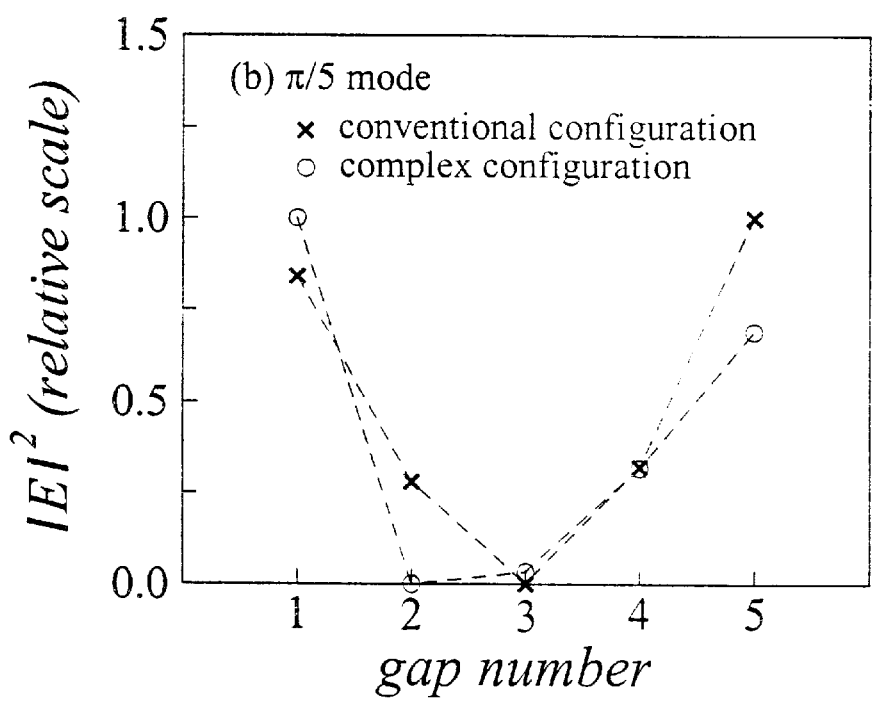
FIG. 15B shows a graph of the relative field strengths for the $\pi/5$ cavity resonance at the five gap positions of C-band cold test models both with and without the coaxial section.

FIG. 15B is a graph showing the relative field strengths for the $\pi/5$ cavity resonance at the five doubly re-entrant cavity gap positions of C-band cold test models both with the integral coupling and bunching section (again illustrated by "o" in the figure") and without the integral coupling and bunching section (again illustrated by "x" in the figure"). The $\pi/5$ cavity mode is indicated at 64, 82 in FIGS. 13A and 13B, respectively. The gap voltage profiles of the $\pi 5$ mode illustrated in FIG. 15B, as expected, are significantly different from those of the $2\pi$ mode illustrated in FIG. 15A. Although the field null of the $\pi/5$ has been shifted from the third gap to the second gap due to the insertion of the integral coupling and bunching section, the gap field profiles for the two configurations are not significantly different. These tests indicate that insertion of the integral coupling and bunching section produces a relatively small effect on the basic properties of the resonant modes, especially those of the 2π cavity if the wave channel of the integral coupling and bunching section is chosen to be a half wavelength of the mode.

Figure 16:
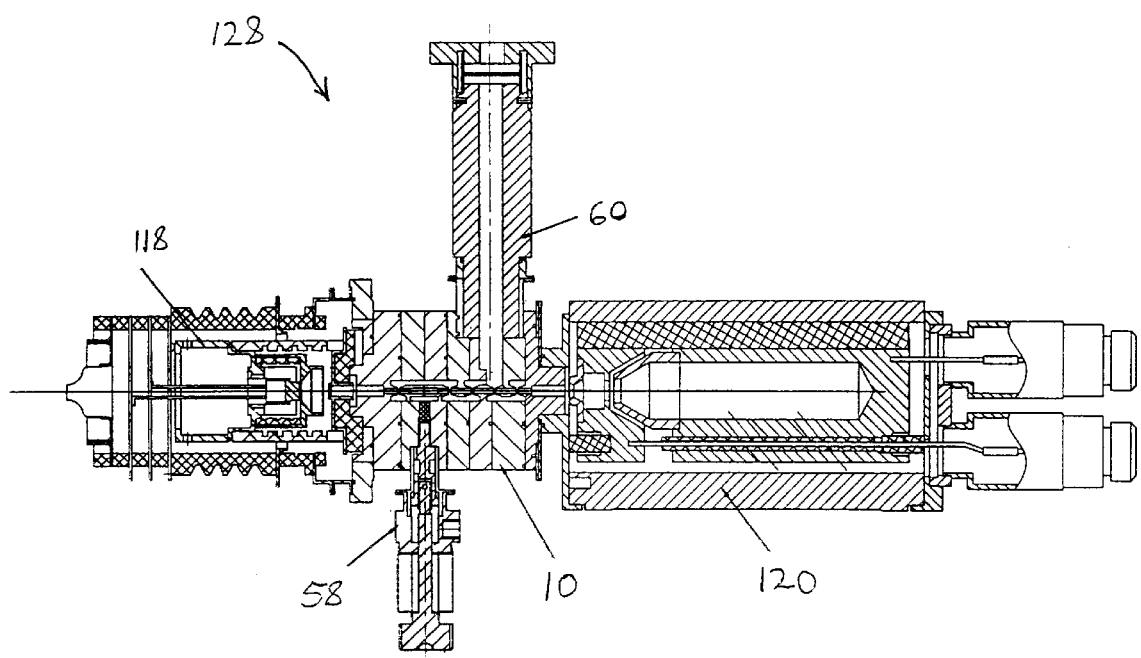
FIG. 16 is a semi-diagrammatic view of an oscillator based on the interaction structure illustrated in FIGS. 1–4.

FIG. 16 illustrates a Ku-band oscillator 128 based on the interaction structure 10. By scaling the various parameters, the present invention can be used to design and construct oscillators having other frequency bands as well. The main body includes the complex extended interaction structure 10, a double-anode Pierce electron gun 118, and a two-stage depressed collector 120. Other types of electron guns can be used with the invention to produce other types of electron beams. The interaction structure 10, electron gun 118, collector 120, tuner 58, and output window 60 are connected with high to ultra-high vacuum connections.

Figure 17:
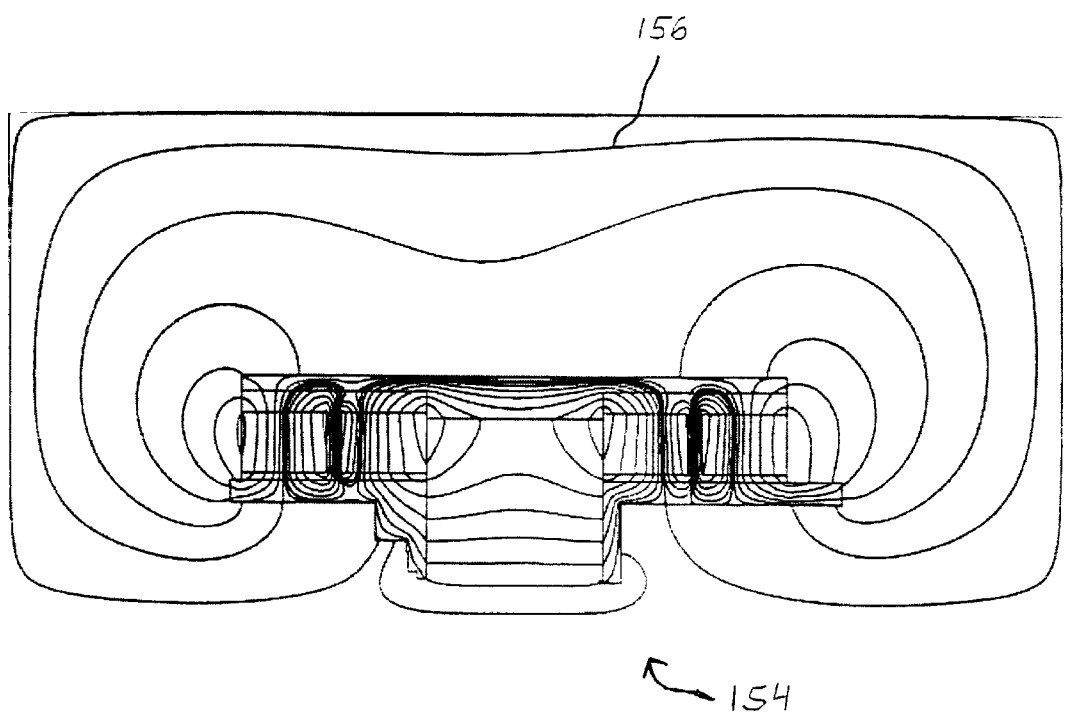
FIG. 17 shows a focusing magnet system with calculated magnetic field contours for one embodiment of the oscillator illustrated in FIG. 16.
Figure 18:
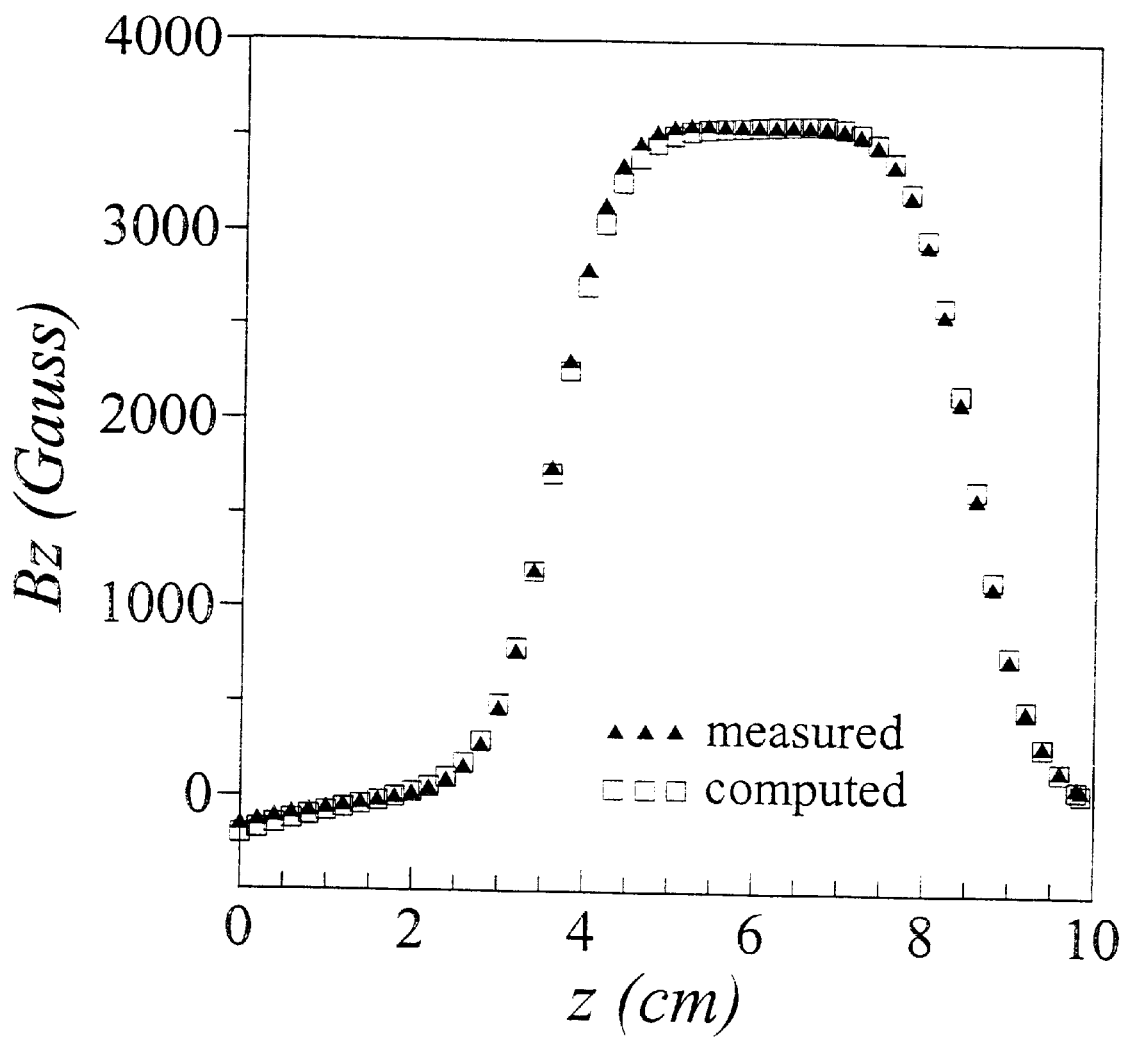
FIG. 18 shows a graph of the calculated and measured axial magnetic field profile of the focusing magnet system of FIG. 17.

The magnetic field is provided by a permanent magnet assembly which employs high performance NdFeB material. FIG. 17 shows the focusing magnet system 154 with calculated magnetic field contours 156. Calculated (indicated by squares) and measured (indicated by triangles) magnetic field profiles are shown in FIG. 18. The vertical axis illustrates the axial magnetic field, measured in Gauss, and the horizontal axis illustrates the axial distance, measured in centimeters, along the oscillator with the cathode serving as the "0 cm" reference point.

Figure 19:
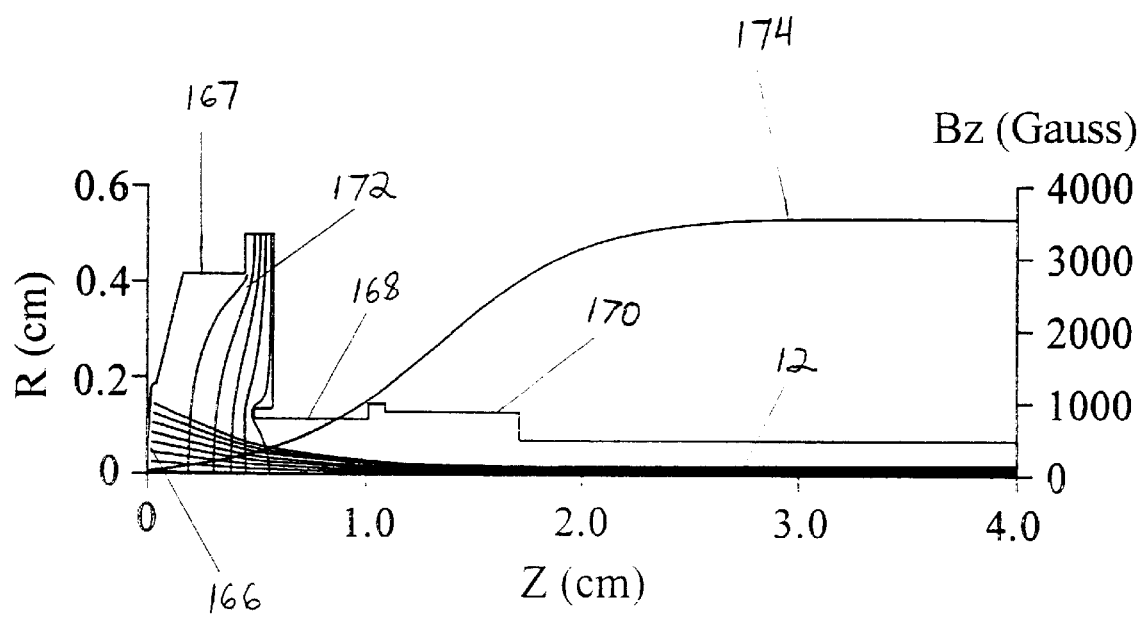
FIG. 19 is a diagrammatic view of the Pierce electron gun, calculated electron trajectories, equipotential lines and axial magnetic field profile for one embodiment of the oscillator illustrated in FIG. 16.

FIG. 19 plots the radial profile of the electron gun 118 along its center or "z-axis". The axis begins at the cathode 166, designated as "0 cm", and extends to the right towards the interaction structure 10. The figure shows a focus electrode 167, a first anode 168 and a second anode 170 of the electron gun 118. Superimposed on the electron gun radial profile are equipotential lines 172, the electron beam profile 12 as well as the axial magnetic field profile 174 of FIG. 18. The left vertical axis thus measures the radius, in centimeters, of the electron gun 118, equipotential lines 172 and electron beam 12 along the electron gun's center axis. The right vertical axis measures the magnetic field, in Gauss, along the electron gun's center axis. The perveance of the electron gun (calculated and measured) is $0.24 \times 10^{-6}$. The interaction structure 10, at ground potential, forms a part of the second anode.

Figure 20:
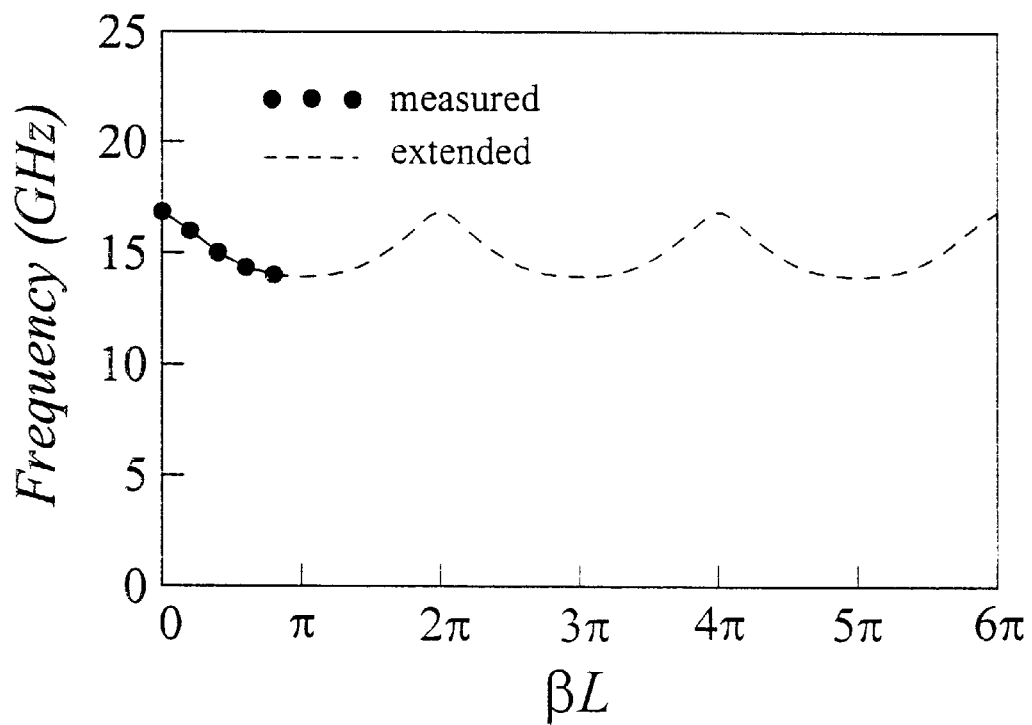
FIG. 20 shows a dispersion diagram of the interaction structure illustrated in FIGS. 1–4.

FIG. 20 plots the ω-β or dispersion diagram of the Ku-band uniformly stacked coupled-cavity structure as constructed from the measured resonant frequencies of the cavity modes. Electron beam and RF field interaction structure of FIG. 1 can be divided by its principal effect into the electron bunching section 98 and the energy extraction section 100. Phase synchronism for extended interaction in the energy extraction section requires:

$$v_b \cong v_{ph} \quad [1]$$

where $v_b$ is the beam velocity and $v_{ph}$ (=ω/β) is the phase velocity of the interacting RF component. The ω-β diagram of FIG. 20 thus fixes the electron velocity by EQUATION 1 and hence the operating voltage of the electron gun used to produce the electron beam 12. The β=0 mode (referred to as he 2π mode) normally has the largest coupling impedance, because the electron beam can be synchronized to experience the maximum field at all of the cavity gaps as illustrated in FIG. 15A. The interaction structure was designed for beam-wave interactions in the second spatial harmonic of the 2π mode (the 4π component). The bunching channel 24 allows for bunching of the electron beam 12. By changing the length of the bunching channel 24, the oscillator 128 can operate in different modes. The Ku-band oscillator 128 was thus operated in the π/5 mode.

For the oscillation to take place in the interaction structure configuration of FIG. 1, the phase shift around a complete loop between the first and second cavities 16, 26 must be an integer multiple 2π. This condition is written as:

$$\omega\tau + \Delta\phi = 2\pi n - \pi/2, n = 1, 2, \quad [2]$$

In EQUATION [2], ω is the resonant frequency, Δφ is the phase lag of the second gap 28 with respect to the first 14, $$\tau = \frac{l}{v_b} = \frac{\alpha\lambda}{v_b} \quad [3]$$

where τ is the transit time of the electrons through the coaxial section 11 and the length l of the beam bunching channel 24 is expressed in terms of the wavelength λ by a multiplication factor α. The π/2 term in EQUATION [2] accounts for the 90° difference between the maximum ac velocity and maximum ac density. This is because electron bunches form around those electrons which are not velocity modulated in the first gap. Substituting EQUATION [3] into EQUATION [2], the wavelength cancels out, resulting in:

$$\frac{c}{v_b} = \frac{1}{\alpha}\left(n - \frac{1}{4} - \frac{\Delta\phi}{2\pi}\right), \quad n = 1, 2, \ldots \quad [4]$$

In addition to meeting the requirements of EQUATION [4], a threshold beam current is also required to start the oscillation in the interaction structure.

In EQUATION [4], $v_b$ can be varied by electron beam voltage adjustment and Δφ can be varied by tuning of resonant frequency. The beam voltage is restricted by EQUATION [1] for synchronous interaction of the beam 12 and wave in subsequent cavities, so the tuner 58 is installed in the coaxial waveguide section 11 to tune the relative phase angle Δφ.

The optimum drift length for the beam bunching channel 24 must also be determined. When the space force is taken into consideration, the ac beam current reaches its maximum value at a quarter of a plasma oscillation length following the velocity modulation. Hence, the optimum distance between the first 14 and second 28 gaps is written:

$$l_{op} = \frac{\pi v_b}{2\omega_q} \quad [5]$$

In EQUATION [5], $\omega_q$ is the reduced plasma frequency defined as $$\omega = F(n_b e^2/\epsilon_o m_e)^{1/2} \quad [6]$$

where $n_b$ is the electron density, $m_e$ is the electron mass, e is the charge of an electron and F is the reduction factor which depends on the beam 12 and beam bunching channel 24 radii.

TABLE 1 lists the parameters that lead to the determination of optimum drift length for the Ku-band embodiment of the present invention. The actual drift length 148 for constructed Ku-band oscillator 128 is close to the calculated optimum value. The above formulas are useful for the determination of nominal design parameters. In the Ku-band oscillator 128, the beam voltage and resonant frequency are fine tuned to attain optimum operation.

TABLE 1

| beam bunching channel raduis (cm) | 0.72 |
| --- | --- |
| operating frequency (GHz) | 16.55 |
| beam voltage (kV) | 14.76 |
| beam velocity (cm/sec) | $7.2 \times 10^9$ |
| beam radius (cm) | 0.03 |
| maximum beam current (A) | 0.49 |
| maximum beam density (1/cm$^3$) | $1.5 \times 10^{11}$ |
| plasma frequency (rad/s) | $2.2 \times 10^{10}$ |
| reduction factor F | 0.29 |
| reduced plasma frequency $\omega_q$ (rad/s) | $6.4 \times 10^9$ |
| optimum drift length $l_{op}$ (cm) | 1.77 |
| actual drift length 148 (cm) | 1.57 |

Parameters for the calculation of the optimum drift length based on the maximum operating beam current and comparison with the actual drift length 148 used in the Ku-band oscillator 128.

Figure 4:
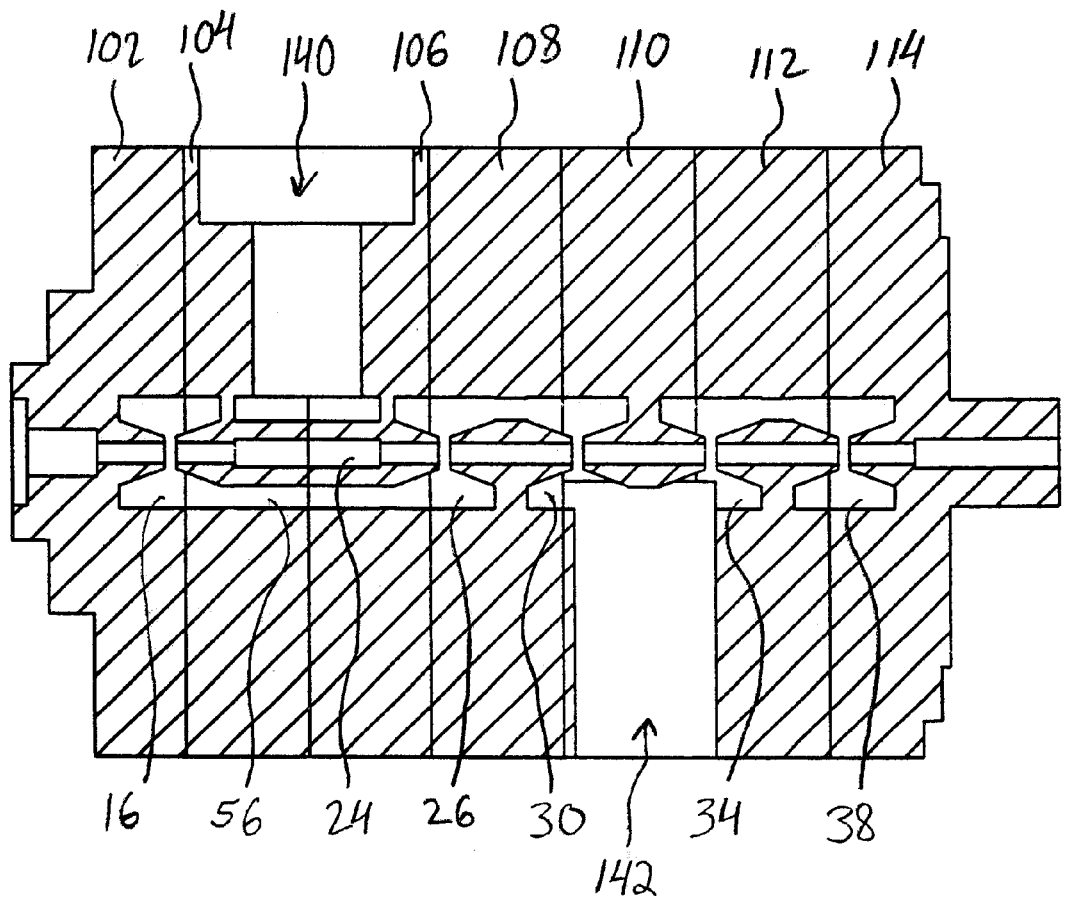
FIG. 4 is a vertical cross-sectional view of the assembled interaction structure of FIG. 3.

The shape and dimensions for each one of the cavities of the Ku-band structure is shown in FIG. 13. The cavity radius 122 should be approximately 0.313 cm and the cavity length 124 should be approximately 0.56 cm. As illustrated in FIG. 4, coupling slots of the first two cavities are aligned at the same azimuthal position and connected by the wave channel 56 of the coaxial section 11. The length of the coaxial wave channel is a half wavelength (0.89 cm) of the $2\pi$ mode. Tuning of the relative phase angle between the first two gaps [$\Delta\phi$ in EQUATION 4] is achieved by a ceramic plunger radially inserted into the wave channel 56 of the coaxial section 11 by using the tuner 58. Alternatively, other suitable materials can be inserted into the wave channel 56 using other methods in order to tune the relative phase angle. Coupling slots of the energy extraction cavities are alternately aligned at opposite ends of a diameter. The axial period 126 as illustrated in FIG. 1 is set to 0.74 cm. The oscillator was operated in the $\pi/5$ mode, but as a result of the electron bunching the oscillator can be made to operate in any other mode by providing coaxial electron drift sections with different lengths. This property distinguishes the present invention from conventional EIO's which can only obtain optimal efficiency and output in the $2\pi$ mode. TABLE 2 lists the operating parameters for the first oscillator. For the purpose of comparison, a second five-cavity oscillator was also built with identical components but without the coaxial section. TABLE 2 also lists the operating parameters for the second oscillator.

TABLE 2

|  | Oscillator #1 | Oscillator #2 |
| --- | --- | --- |
| mode | $\pi/5$ | $2\pi$ |
| axial period L (cm) | 0.74 | 0.74 |
| frequency (GHz) | 16.55 | 16.93 |
| peak output power (kW) | 2.15 | 1.41 |
| cathode voltage (kV) | 14.76 | 16.02 |
| cathode current (A) | 0.49 | 0.49 |
| heater voltage (V) | 6.3 | 6.3 |
| heater current (A) | 1.0 | 1.0 |
| stage 1 collector voltage (kV) | 12.6 | 13.8 |
| stage 2 collector voltage (kV) | 7.0 | 9.3 |
| stage 1 collector current (A) | 0.226 | 0.147 |
| stage 2 collector current (A) | 0.208 | 0.268 |
| body voltage | ground | ground |
| focusing system | Permanent Magnets | Permanent Magnets |
| electronic efficiency | 29.7% | 18.0% |
| total efficiency | 40.9% | 24.7% |

TABLE 2-continued

|  | Oscillator #1 | Oscillator #2 |
| --- | --- | --- |
| weight (kg) | 8.0 | 8.0 |
| cooling | water | water |

Operating parameters and performance comparison of Ku-band oscillators with (Oscillator #1) and without (Oscillator #2) the integral coupling and bunching section.

Figure 21A:
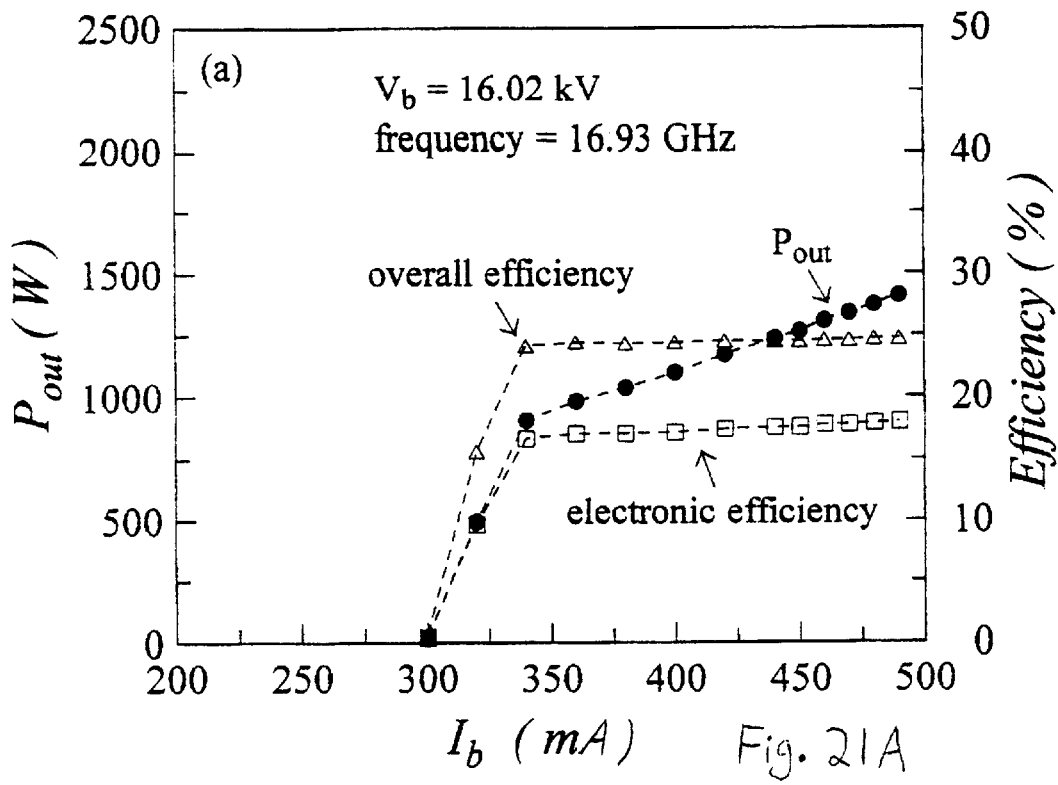
FIG. 21A is a graph showing peak power, electronic efficiency, and overall efficiency versus the beam current for an oscillator utilizing an interaction structure without the integral coupling and bunching section interaction for comparison with the results illustrated in FIG. 21B.
Figure 21B:
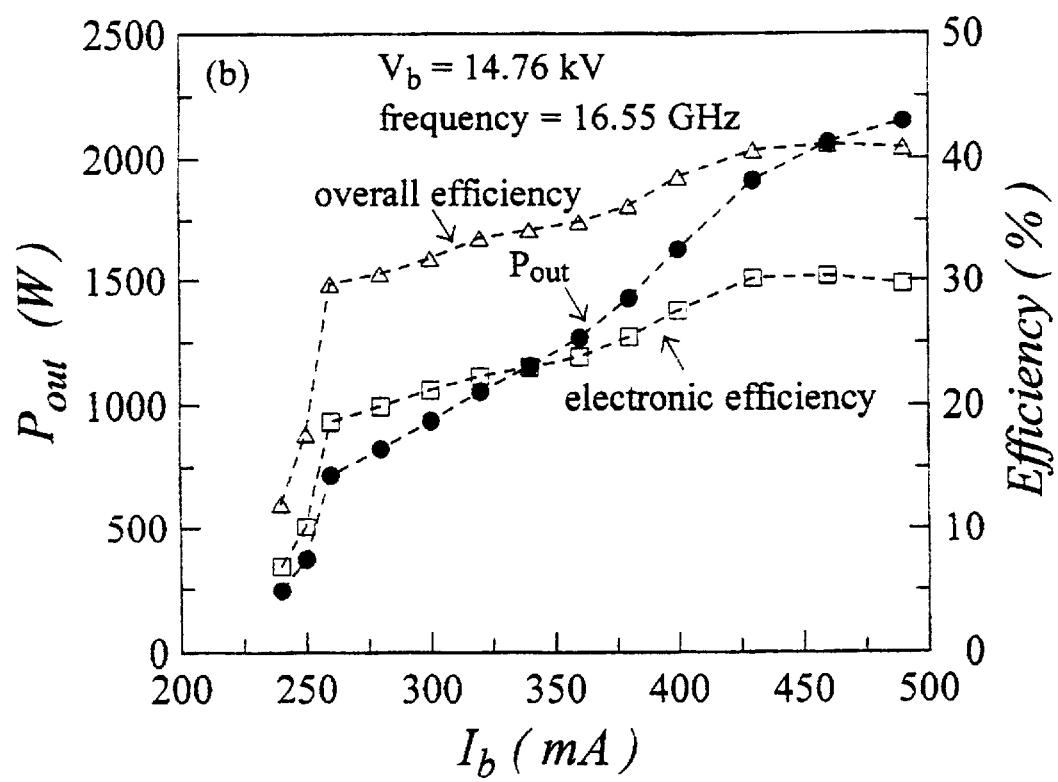
FIG. 21B is a graph showing peak power, electronic efficiency, and overall efficiency versus the beam current for an oscillator utilizing one embodiment of the interaction structure with integral coupling and bunching section of the present invention.

FIGS. 21A and 21B illustrate test results for Oscillator #2 and Oscillator #1 respectively. The vertical axes indicate power, measured in Watts, and efficiency, while the horizontal axes indicate beam current measured in milliamps. The figures illustrate output power, electronic efficiency and overall efficiency as a function of the beam current. Comparison of FIG. 21B with FIG. 21A clearly indicates a significant efficiency enhancement due to the insertion of the coaxial section 11. Ballistic bunching in the coaxial section 11 improves continuously with increasing beam current, as is evidenced by the continued rise of the electronic efficiency in FIG. 21B. On the other hand, as illustrated in FIG. 21A, the electronic efficiency of Oscillator #2, without the coaxial section, tends to saturate early during the rise of the beam current. This is a further indication of the greater power capability of the interaction structure of the present invention.

Figure 2:
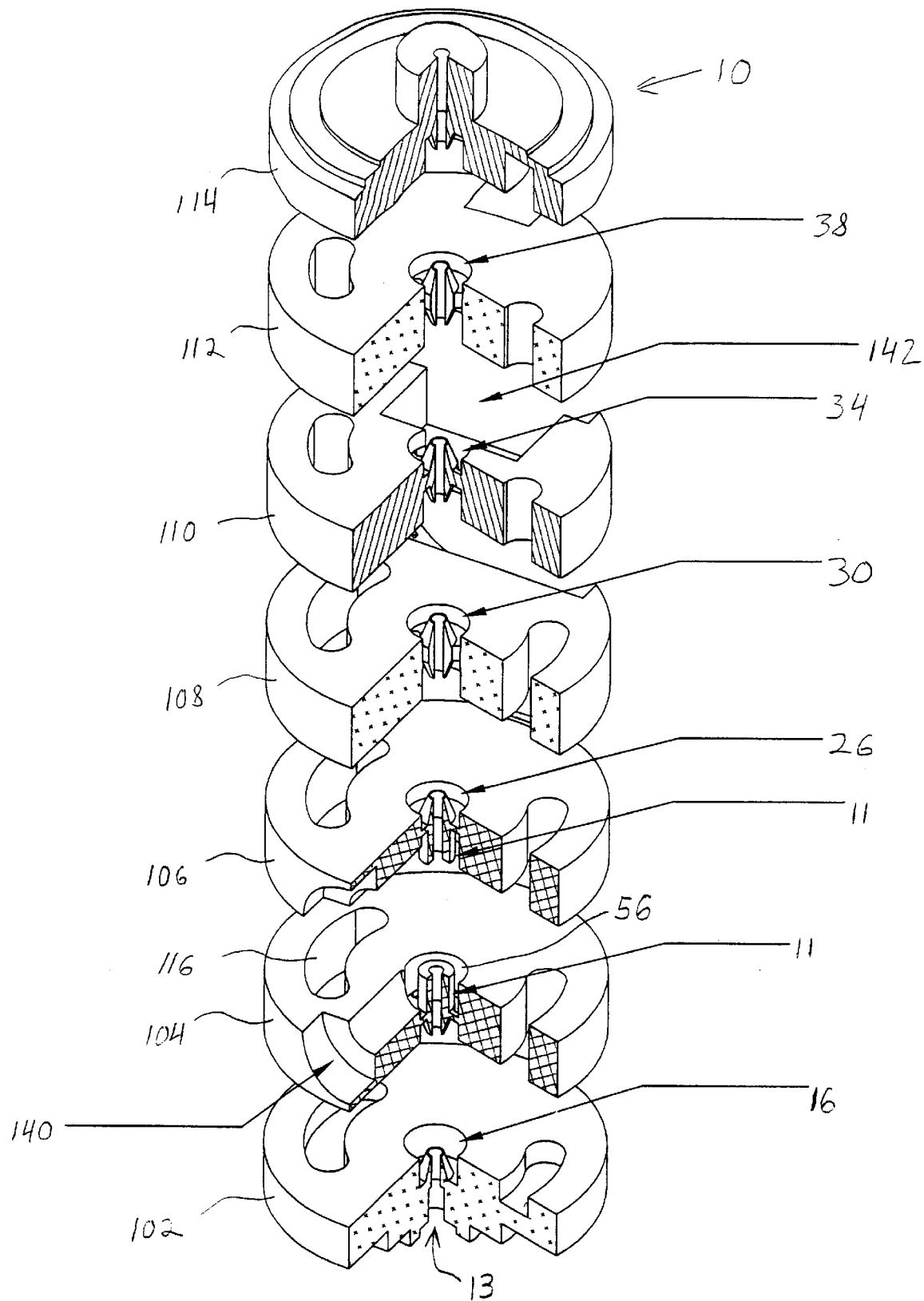
FIG. 2 is a partial vertical cross-sectional exploded perspective view of one embodiment of the interaction structure of the present invention.
Figure 3:
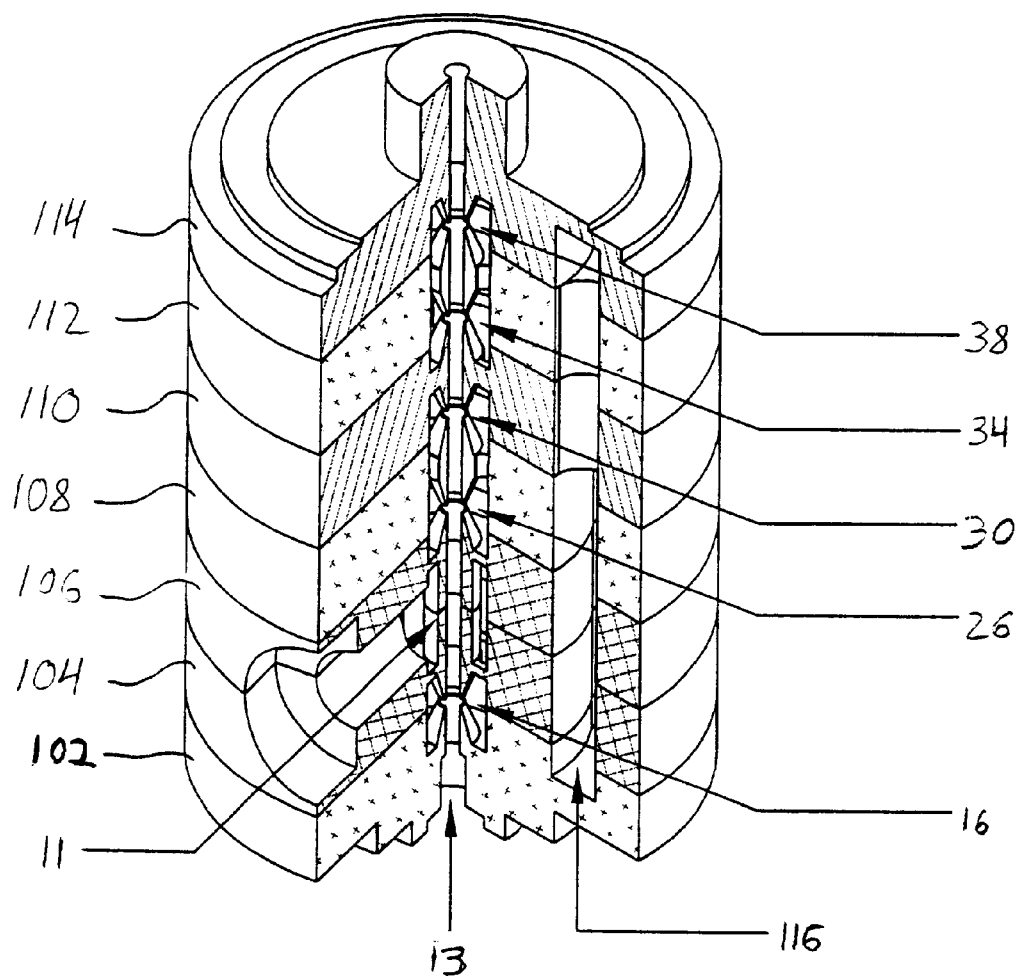
FIG. 3 is a partial vertical cross-sectional perspective view of the assembled interaction structure of FIG. 2.

FIGS. 2–12 illustrate the pieces used in constructing the Ku-band interaction structure 10 of one embodiment of the present invention. First, referring to FIGS. 2, 3 and 4, the interaction structure 10 is constructed from a first cavity piece 102, a left coaxial section piece 104, a right coaxial section piece 106, a second cavity piece 108, a third cavity piece 110, a fourth cavity piece 112 and a fifth cavity piece 114. The pieces can be machined from stainless steel, aluminum, copper, or combinations of materials selected to provide the proper strength and conductivity for the cavity walls. The electron beam channel 13 passes through the interaction structure 10. Water cooling channels 116 can be passed through the interaction structure 10. Cooled water can be circulated through the water cooling channels 116 in order to remove heat from the interaction structure 10 caused by electromagnetic ohmic heating and interception of the electron beam 12 by the walls of the structure. As illustrated in FIG. 3, the pieces are attached together using conventional vacuum connection techniques to form a common vacuum between the cavities, wave channel 56 and the electron beam channel 13. The vacuum can be such that the oscillator operates at a pressure in the range of $10^{-7}$ to $10^{-9}$ Torr. For example grooves can be machined in the faces of the pieces and O-rings inserted in the grooves. The pieces can then be forced together to form a vacuum connection utilizing screws passing through holes also passing through the faces. Alternatively, circular knife edges can be machined into the faces and copper gaskets positioned so that the knife edges dig into the copper upon tightening of the screws.

Figure 5A:
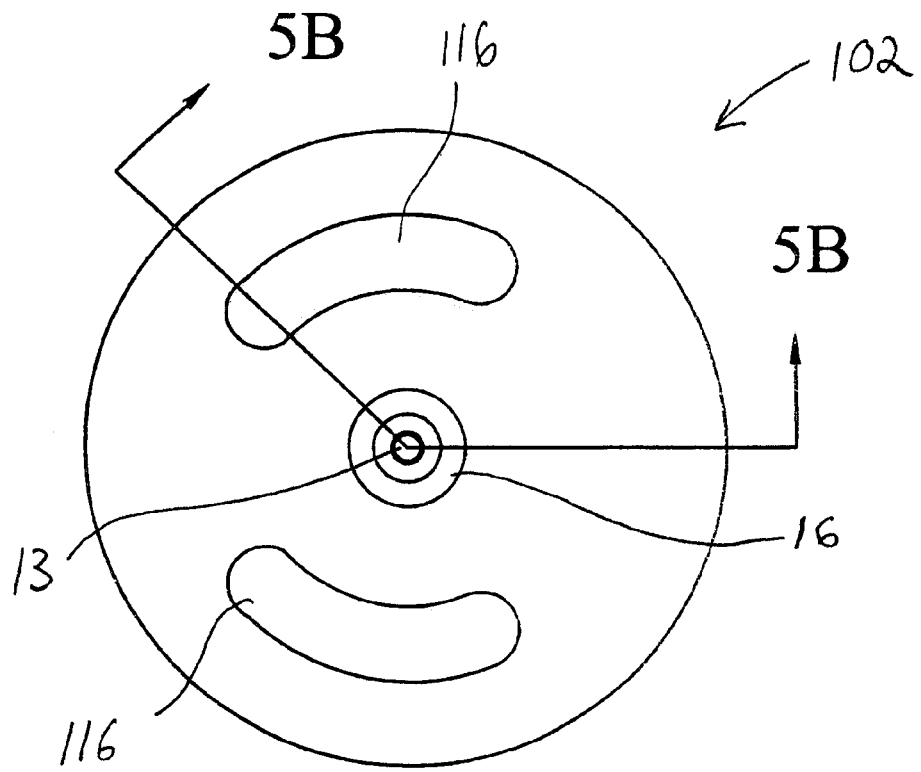
FIG. 5A is a top plan view of a first cavity piece of the interaction structure of FIGS. 2–4.
Figure 5B:
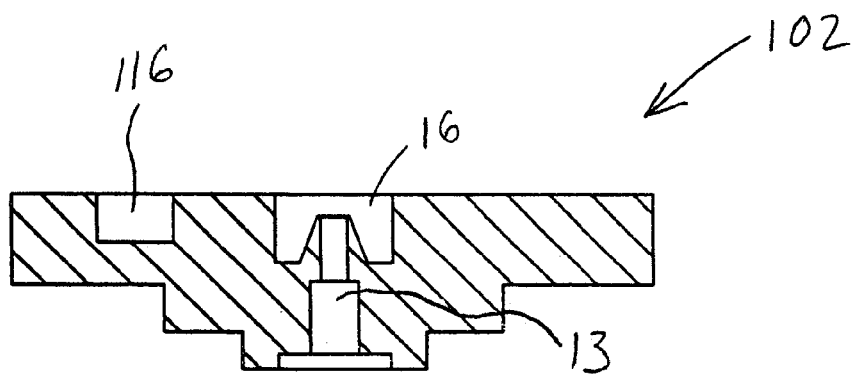
FIG. 5B is a horizontal cross sectional view of the first cavity piece taken on line 5B—5B of FIG. 5A.

FIGS. 5A and 5B show the first cavity piece 102 of the interaction structure of FIGS. 2, 3, 4. The first cavity piece 102 includes a portion of the first cavity 16 as well as portions of the water cooling channels 116. Passing through the center of the first cavity piece 102 is the electron beam channel 13.

Figure 6A:
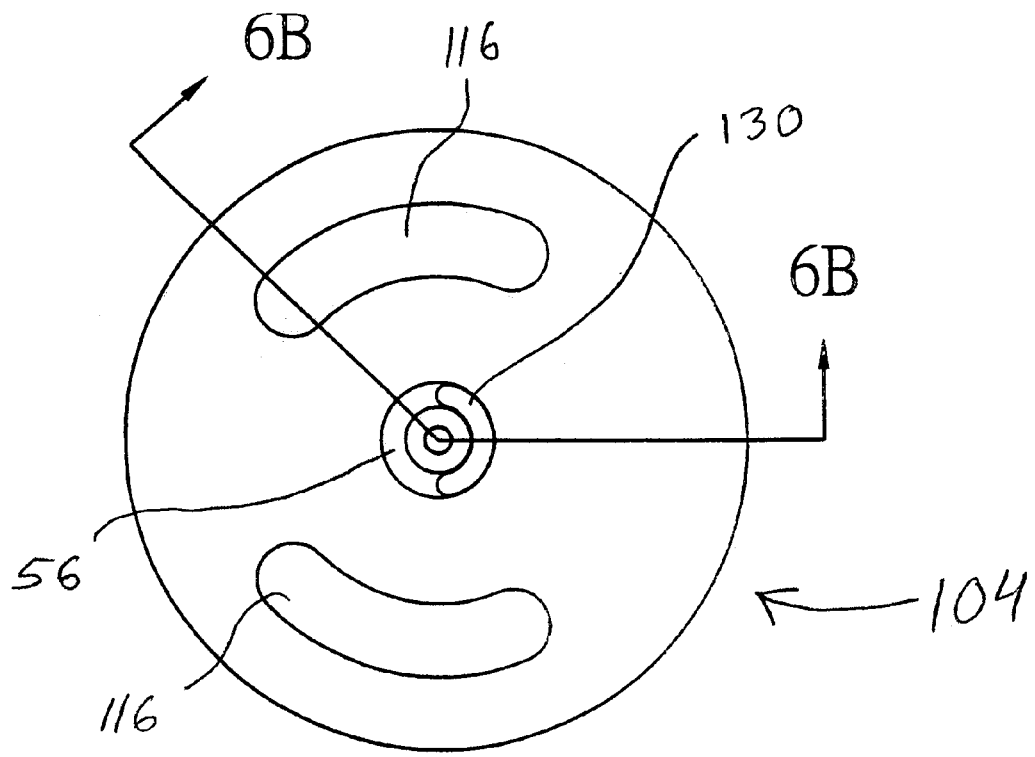
FIG. 6A is a top plan view of a left coaxial section piece of the interaction structure of FIGS. 2–4.
Figure 6B:
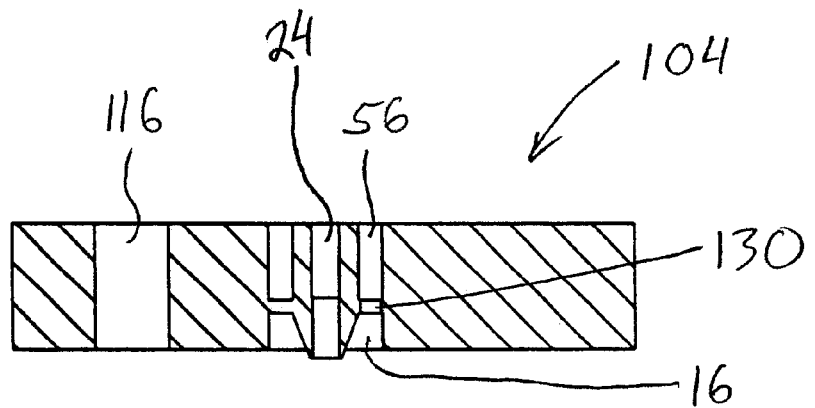
FIG. 6B is a horizontal cross sectional view of the left coaxial section piece taken on line 6B—6B of FIG. 6A.

FIGS. 6A and 6B show the left coaxial section piece 104 of the interaction structure of FIG. 2. The left coaxial section piece 104 includes a portion of the first cavity 16, a portion of the wave channel 56 as well as portions of the water cooling channels 116. Passing through the center of the left coaxial section piece 104 is a portion of the beam bunching channel 24 section of the electron beam channel 13. A first coupling slot 130 is formed in an end wall of the first cavity 16 for coupling to the wave channel 56. As shown in FIGS. 2, 3 and 4, the left coaxial section piece 104 has a portion of a tuner port 140 machined to accommodate a portion of the tuner 58.

Figure 7A:
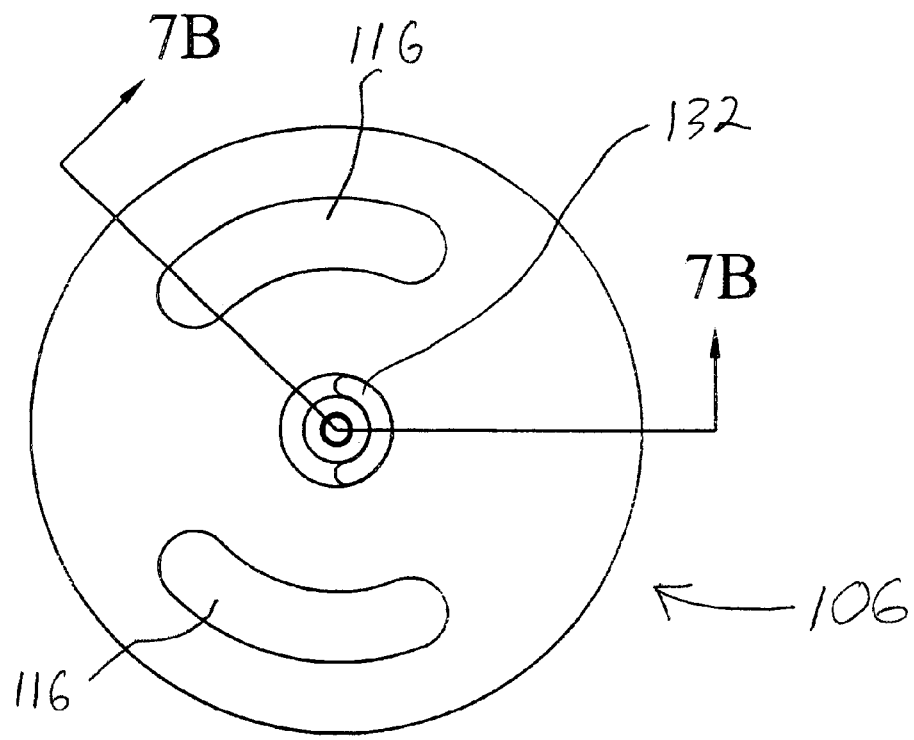
FIG. 7A is a top plan view of a right coaxial section piece of the interaction structure of FIGS. 2–4.
Figure 7B:
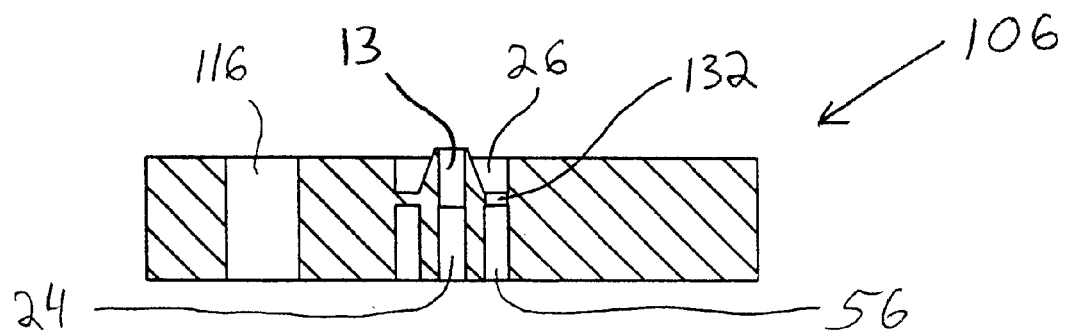
FIG. 7B is a horizontal cross sectional view of the right coaxial section piece taken on line 7B—7B of FIG. 7A.

FIGS. 7A and 7B show the right coaxial section piece 106 of the interaction structure of FIGS. 2, 3, 4. The right coaxial section piece includes a portion of the second cavity 26, a portion of the wave channel 56 as well as portions of the water cooling channels 116. Passing through the center of the right coaxial section piece 106 is a portion of the beam bunching channel 24 section of the electron beam channel 13. A second coupling slot 132 is formed in an end wall of the second cavity 26 for coupling between the wave channel 56 and the second cavity 26. As shown in FIGS. 2, 3 and 4, the right coaxial section piece 106 also has a portion of the tuner port 140 machined to accommodate a portion of the tuner 58.

Figure 8A:
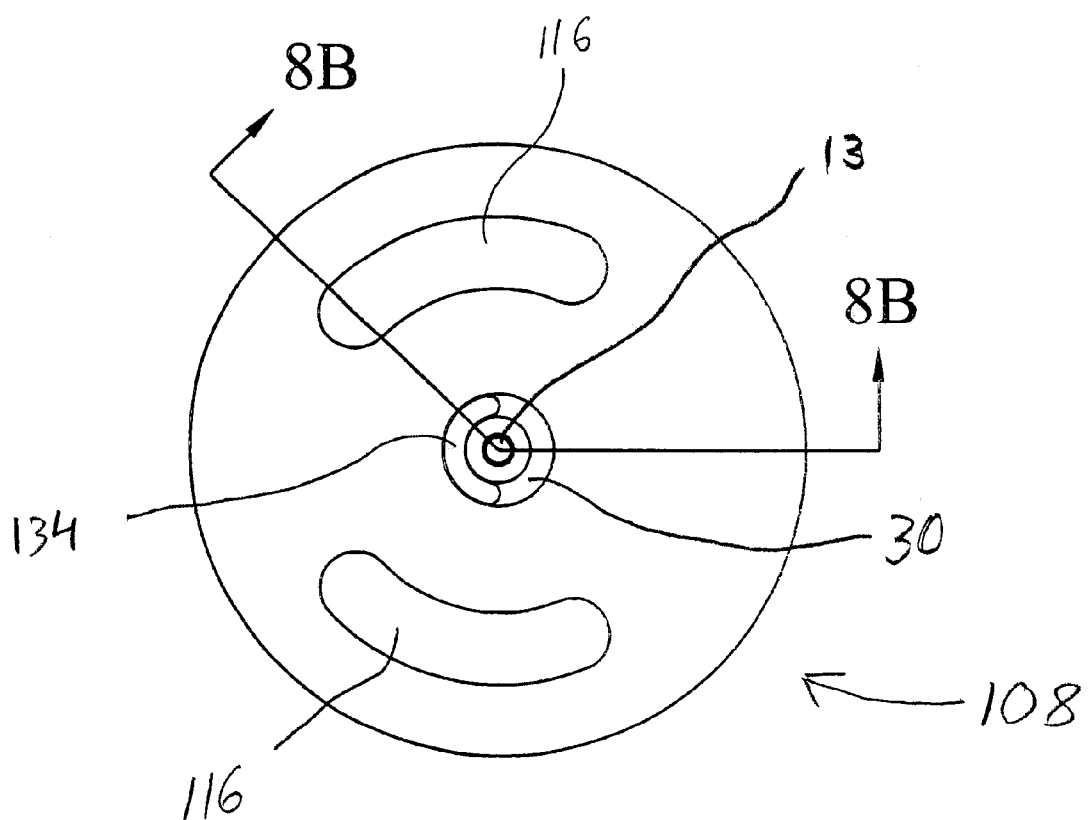
FIG. 8A is a top plan view of a second cavity piece of the interaction structure of FIGS. 2–4.
Figure 8B:
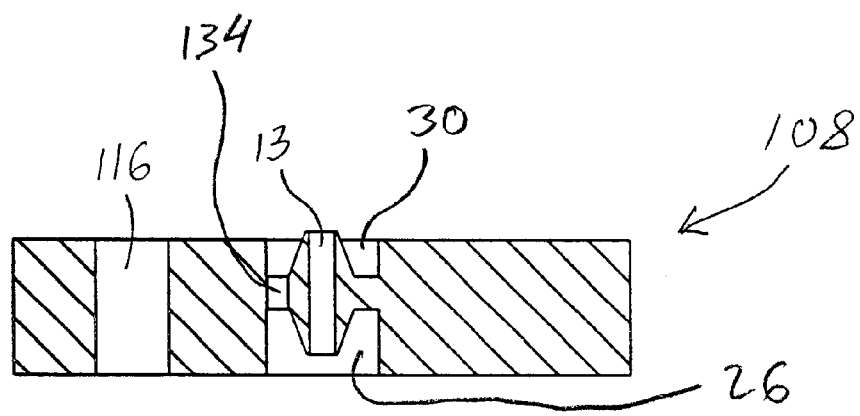
FIG. 8B is a horizontal cross sectional view of the second cavity piece taken on line 8B—8B of FIG. 8A.

FIGS. 8A and 8B show the second cavity piece 108 of the interaction structure of FIGS. 2, 3, 4. The second cavity piece 108 includes a portion of the second cavity 26, a portion of the third cavity 30, as well as portions of the water cooling channels 116. Passing through the center of the second cavity piece 108 is a portion of the electron beam channel 13. A third coupling slot 134 is formed in the end wall connecting the second cavity 26 and the third cavity 30. As shown in FIGS. 2, 3 and 4, the second cavity piece 108 also has a portion of an output window port 142 machined to accommodate a portion of the output window 60.

Figure 9A:
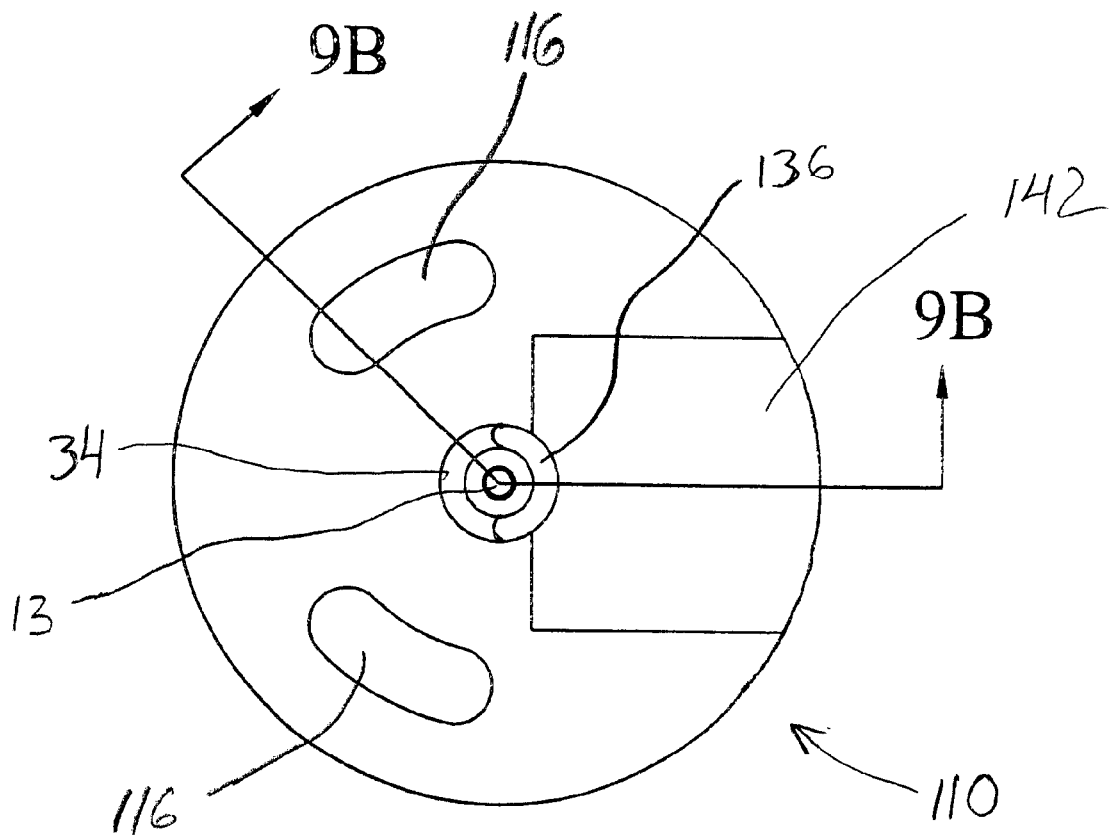
FIG. 9A is a top plan view of a third cavity piece of the interaction structure of FIGS. 2–4.
Figure 9B:
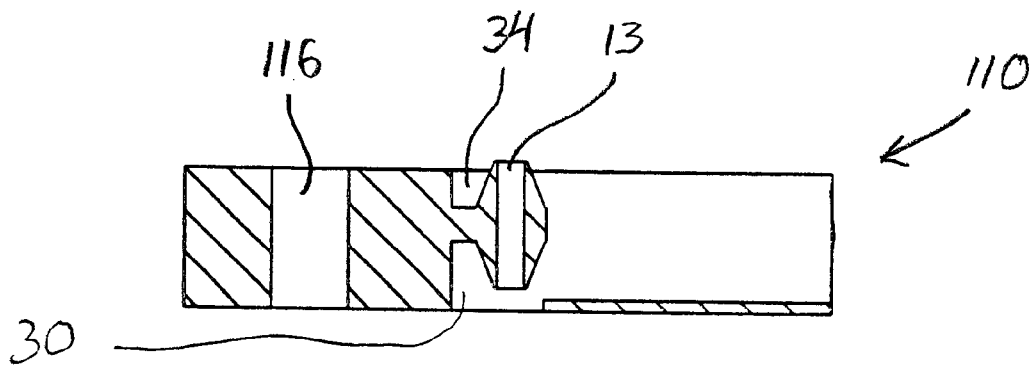
FIG. 9B is a horizontal cross sectional view of the third cavity piece taken on line 9B—9B of FIG. 9A.

FIGS. 9A and 9B show the third cavity piece 110 of the interaction structure of FIGS. 2, 3, 4. The third cavity piece 110 includes a portion of the third cavity 30, a portion of the fourth cavity 34, as well as portions of the water cooling channels 116. Passing through the center of the third cavity piece 110 is a portion of the electron beam channel 13. A fourth coupling slot 136 is formed in the end wall connecting the third cavity 30 and the fourth cavity 34. The third cavity piece 110 also has a portion of the output window port 142 machined to accommodate a portion of the output window 60.

Figure 10A:
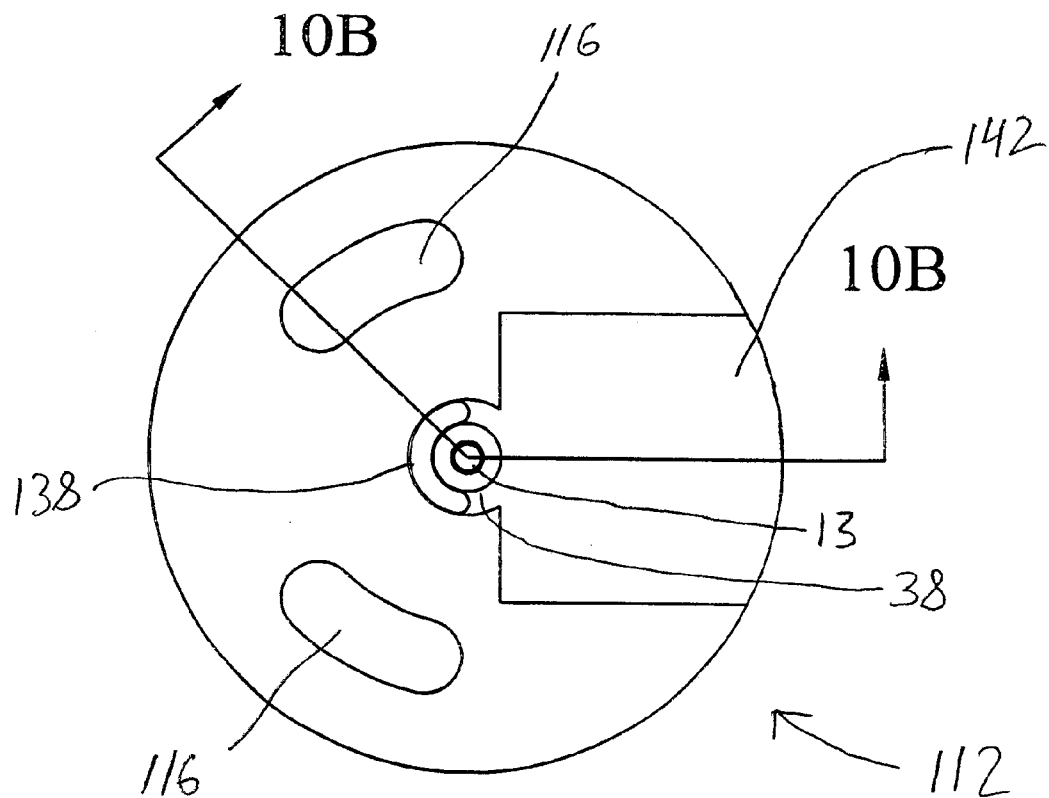
FIG. 10A is a top plan view of a fourth cavity piece of the interaction structure of FIGS. 2–4.
Figure 10B:
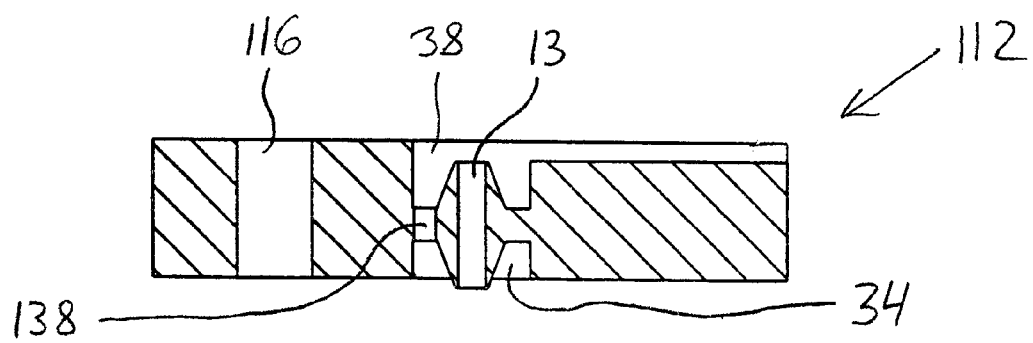
FIG. 10B is a horizontal cross sectional view of the fourth cavity piece taken on line 10B—10B of FIG. 10A.

FIGS. 10A and 10B show the fourth cavity piece 112 of the interaction structure of FIGS. 2, 3, 4. The fourth cavity piece 112 includes a portion of the fourth cavity 34, a portion of the fifth cavity 38, as well as portions of the water cooling channels 116. Passing through the center of the fourth cavity piece 112 is a portion of the electron beam channel 13. A fifth coupling slot 138 is formed in the end wall connecting the fourth cavity 34 and the fifth cavity 38. The fourth cavity piece 112 also has a portion of the output window port 142 machined to accommodate a portion of the output window 60.

Figure 11A:
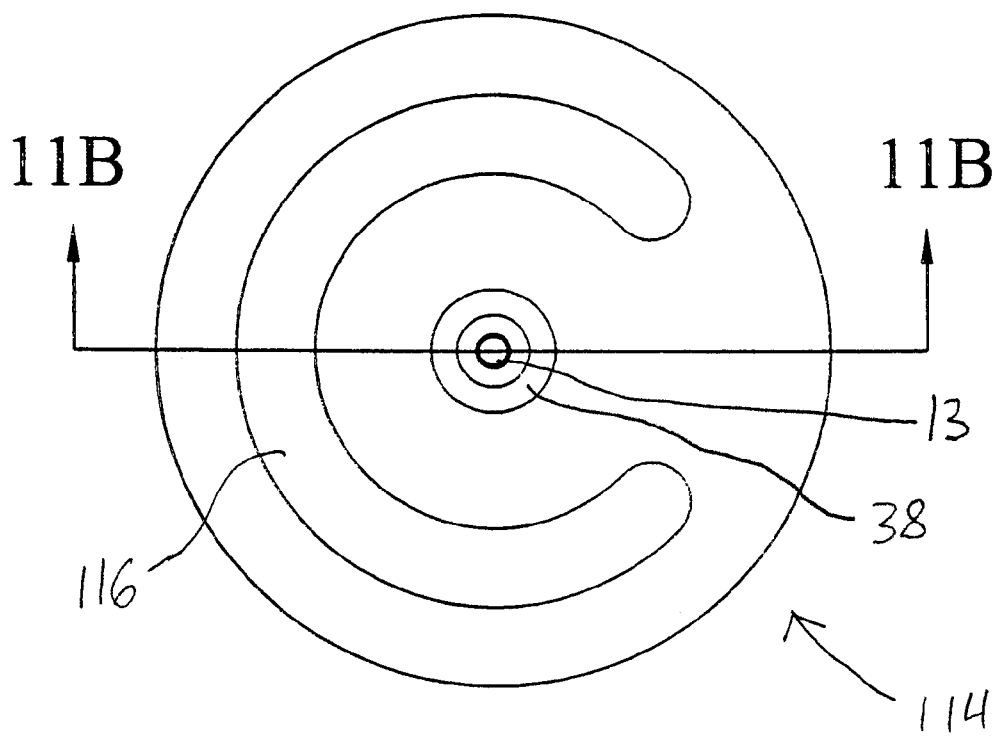
FIG. 11A is a top plan view of a fifth cavity piece of the interaction structure of FIGS. 2–4.
Figure 11B:
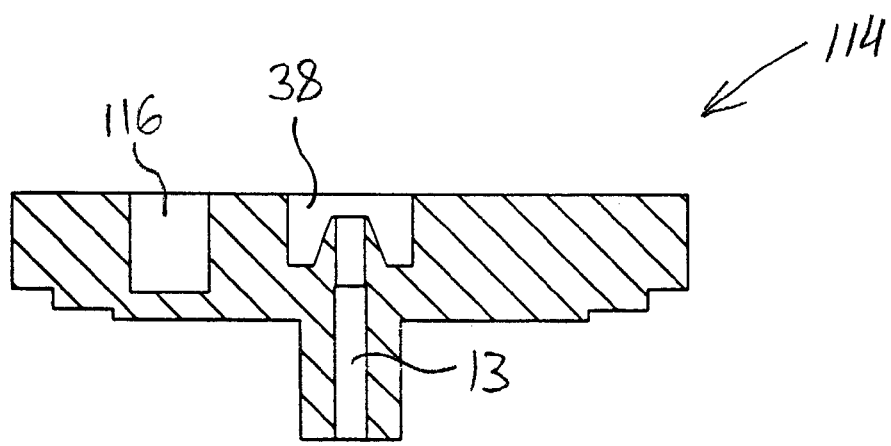
FIG. 11B is a horizontal cross sectional view of the fifth cavity piece taken on line 11B—11B of FIG. 11A.

FIGS. 11A and 11B show the fifth cavity piece 114 of the interaction structure of FIG. 2. The fifth cavity piece 114 includes a portion of the fifth cavity 38 as well as portions of the water cooling channels 116. Passing through the center of the fifth cavity piece 114 is a portion of the electron beam channel 13.

Figure 12:
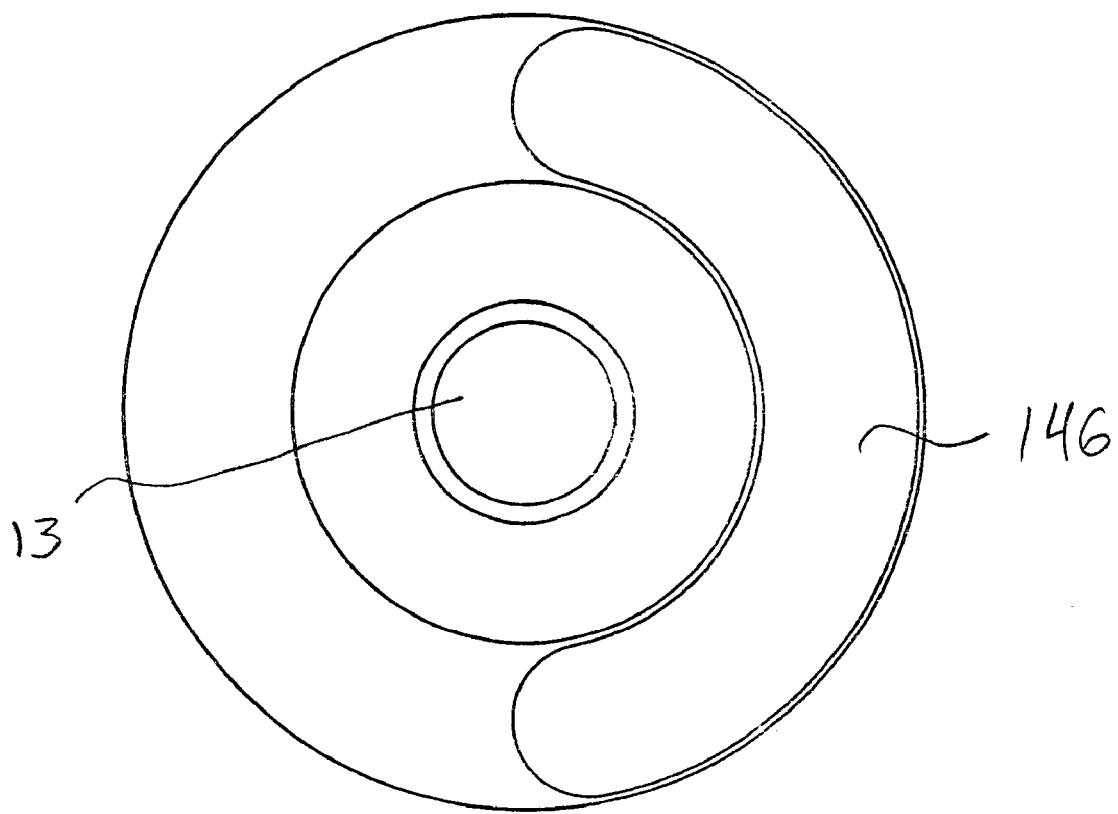
FIG. 12 is a top plan view of a cavity inner end wall of the cavities shown in FIG. 3, having a drift tube extending through the center and a coupling slot for coupling between cavities.

FIG. 12 shows an enlarged view a cavity inner end wall of the cavities illustrated in FIGS. 6A, 6B, 7A, 7B, 8A, 8B, 9A, 9B, 10A, 10B. The electron beam channel 13 extends through the center and a coupling slot 146 represents one of the coupling slots 130, 132, 134, 136, 138 for coupling between the cavities.

Figure 22:
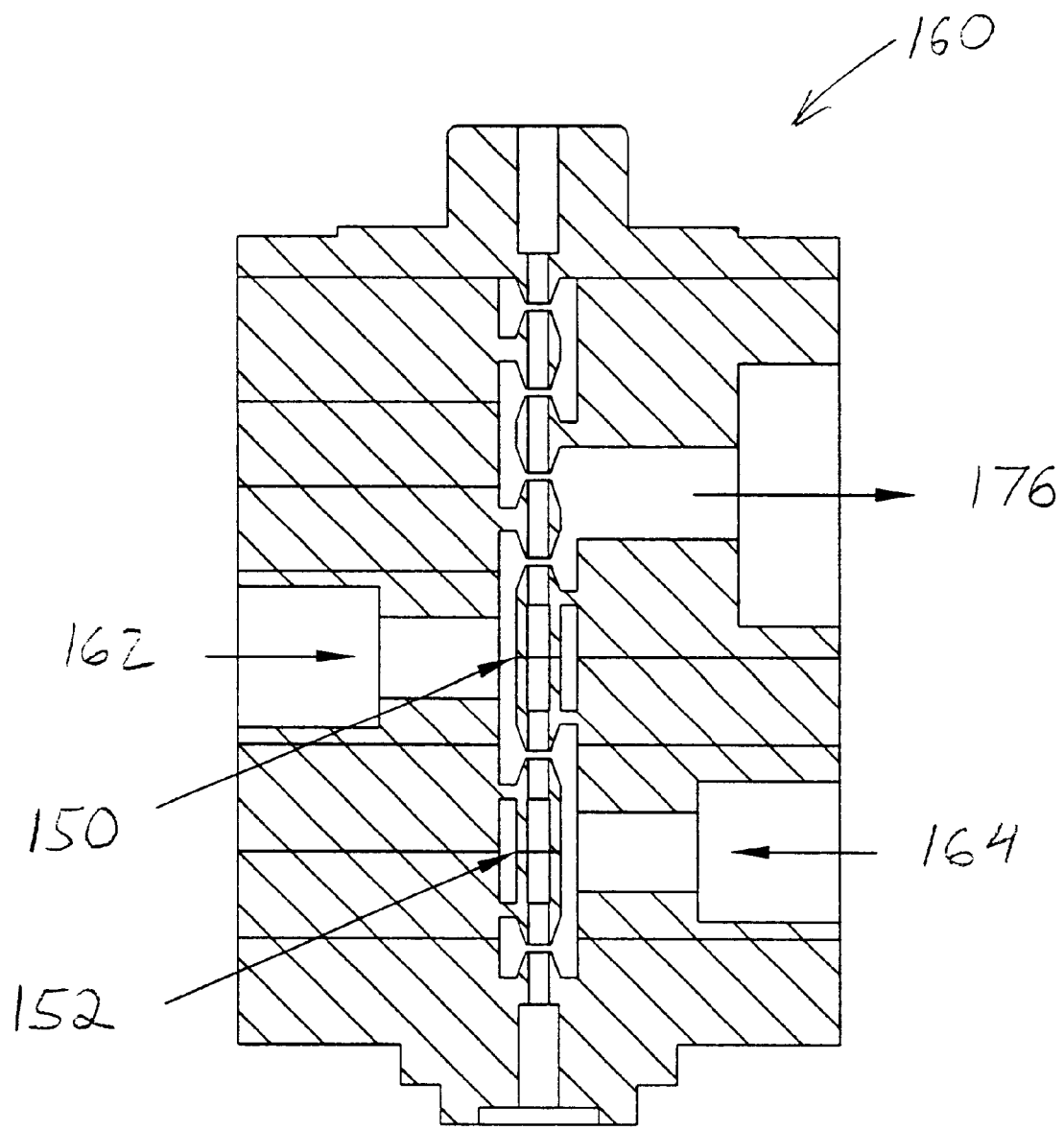
FIG. 22 is a diagrammatic vertical cross-sectional view of a multiple-bunching section interaction structure according to an embodiment of the present invention.

The interaction structure of the present invention is not limited to utilizing a single integral coupling and bunching section. Additional integral coupling and bunching sections can be utilized in an interaction structure 160. Further, the interaction structure of the present invention is not limited to five cavities. A greater or lesser number of cavities can be used. For example, FIG. 22 shows a six cavity embodiment of the present invention utilizing two coaxial sections 150, 152. Each of the coaxial sections 150, 152 has a tuner port 162, 164 extending into its respective wave channel. The power leaves the interaction structure 160 through an output port 176.

While the above description contains many specific features of the invention, these should not be construed as limitations on the scope of the invention, but rather as exemplary embodiments thereof. Many other variations are possible. Accordingly, the scope of the invention should be determined not by the embodiments illustrated, but by the appended claims and their legal equivalents.

What is claimed is:

1. An interaction structure for producing electromagnetic radiation having an integral coupling and bunching section, comprising:

a first cavity for electromagnetically interacting with an electron beam;

a second cavity having a second gap for electromagnetically interacting with the electron beam;

an inner conductor and an outer conductor forming the integral coupling and bunching section;

a wave channel passing between the inner and outer conductors of the integral coupling and bunching section, the wave channel for electromagnetically coupling the first and second cavities through coupling slots in walls of the first and second cavities; and a beam bunching channel passing through the inner conductor of the integral coupling and bunching section, the radius of the beam bunching channel smaller than a cutoff radius to provide a region essentially free of electromagnetic fields within the beam bunching channel, the beam bunching channel having a length for providing ballistic bunching of the electron beam between the first and second cavities.

2. The interaction structure of claim 1, wherein:

the first and second cavities are doubly re-entrant cavities.

3. The interaction structure of claim 1, further comprising:

a cascade of electromagnetically coupled cavities, the second cavity serving as a part of the cascade of electromagnetically coupled cavities and serving to attach the integral coupling and bunching section to the cascade of electromagnetically coupled cavities.

4. The interaction structure of claim 1, wherein:

the integral coupling and bunching section is a coaxial waveguide section.

5. The interaction structure of claim 1, further comprising:

a tuner installed in the integral coupling and bunching section, the tuner having a portion adjustably extending into the wave channel and interacting with electromagnetic fields in the wave channel to tune the resonant frequency of the interaction structure.

6. The interaction structure of claim 1, wherein:

the wave and beam bunching channels share a common vacuum.

7. The interaction structure of claim 1, wherein:

the beam bunching channel has a length for achieving a substantially optimized alternating current beam current at the second cavity.

8. The interaction structure of claim 5, further comprising:
a second integral coupling and bunching section portion of the interaction structure with a second tuner having a portion adjustably extending into a second wave channel of the second integral coupling and bunching section and interacting with electromagnetic fields in the second wave channel to tune the resonant frequency of the interaction structure.

9. A method for generating electromagnetic radiation using an oscillator based on an interaction structure having an integral coupling and bunching section, comprising the steps of:

generating an electron beam;

modulating the velocity of the electron beam by passing the electron beam across a first gap of a first cavity so that the electron beam interacts electromagnetically with the first cavity;

ballistically bunching the electron beam by passing the electron beam through an integral coupling and bunching section having an inner conductor and an outer conductor, the electron beam passing through a beam bunching channel passing through the inner conductor, the radius of the beam bunching channel smaller than a cutoff radius to provide a region essentially free of electromagnetic fields within the beam bunching channel, the beam bunching channel having a length for providing ballistic bunching of the electron beam;

driving a gap voltage across a second gap of a second cavity by passing the electron beam through the second cavity so that the electron beam interacts electromagnetically with the second cavity; and providing feedback between the first and second cavities by electromagnetically coupling the first and second cavities through coupling slots in walls of the first and second cavities, the coupling slots connected by a wave channel passing between the inner and outer conductors.

10. The method of claim 9, further comprising the step of passing the electron beam through first and second doubly re-entrant cavities.

11. The method of claim 9, further comprising the step of:
passing the electron beam through a cascade of electromagnetically coupled cavities, the second cavity serving as a part of the cascade of electromagnetically coupled cavities and serving to attach the integral coupling and bunching section to the cascade of electromagnetically coupled cavities.

12. The method of claim 9, further comprising the step of:
passing the electron beam through a beam bunching channel passing through an inner conductor of a coaxial waveguide section and providing feedback between the first and second cavities by electromagnetically coupling the first and second cavities through a wave channel passing between the inner conductor and an outer conductor of the coaxial waveguide section.

13. The method of claim 9, further comprising the step of:
tuning the resonant frequency of the interaction structure of the interaction structure by adjustably extending a portion of a tuner installed in the integral coupling and bunching section into the wave channel to interact with electromagnetic fields in the wave channel.

14. The method of claim 9, further comprising the step of:
forming a common vacuum between the wave channel and beam bunching channel.

15. The method of claim 9, further comprising the step of:
passing the electron beam through the beam bunching channel having a length so that a substantially optimized alternating current beam current is achieved at the second gap.

16. The method of claim 9, further comprising the step of:
extracting electromagnetic radiation from the oscillator through an output window coupled to the interaction structure.

17. The method of claim 9, further comprising the step of:
collecting the electron beam after the electron beam has passed through the interaction structure.

18. The method of claim 13, further comprising the step of:
tuning the resonant frequency of the interaction structure by adjustably extending a portion of a second tuner into a second wave channel of a second integral coupling and bunching section.

19. An oscillator based on an interaction structure having an integral coupling and bunching section producing backward wave oscillations, comprising:

an electron beam generated by an electron gun;

a first doubly re-entrant cavity having a gap disposed so that the electron beam passes across the gap, the gap having a gap voltage which modulates the electron beam;

a cascade of electromagnetically coupled doubly re-entrant energy extraction cavities having gaps disposed so that the electron beam passes across the gaps and transfers energy from the electron beam to the electromagnetic fields in the cascade of electromagnetically coupled doubly re-entrant energy extraction cavities;

a coaxial waveguide section having an inner conductor and an outer conductor forming the first integral coupling and bunching section;

a wave channel passing between the inner and outer conductors of the coaxial waveguide section, the wave channel electromagnetically coupling the first doubly re-entrant cavity with the cascade of electromagnetically coupled doubly re-entrant energy extraction cavities through coupling slots in walls of the cavities and providing feedback from the cascade of electromagnetically coupled doubly re-entrant energy extraction cavities to the first doubly re-entrant cavity;

a tuner installed in the coaxial waveguide, the tuner having a portion adjustably extending into the wave channel and interacting with electromagnetic fields in the wave channel to tune the resonant frequency of the interaction structure and create a feedback condition so that the oscillator oscillates and the cascade of electromagnetically coupled doubly re-entrant energy extraction cavities drive the first doubly re-entrant cavity;

the cascade of electromagnetically coupled doubly re-entrant energy extraction cavities having a second doubly re-entrant energy extraction cavity attaching the coaxial waveguide section to the cascade of electromagnetically coupled doubly re-entrant energy extraction cavities, the second doubly re-entrant cavity having a second gap disposed so that the electron beam passes across the second gap, the electron beam driving a gap voltage across the second gap.

a beam bunching channel passing through the inner conductor of the integral coupling and bunching section and through which the electron beam passes, the radius of the beam bunching channel smaller than a cutoff radius, thus providing a region essentially free of electromagnetic fields within the beam bunching channel, the beam bunching along the length of the beam bunching channel and achieving a substantially optimized alternating current beam current at the second gap;

an output window coupled to the cascade of electromagnetically coupled doubly re-entrant energy extraction cavities for extracting electromagnetic radiation from the oscillator; and a collector for collecting the electron beam after the electron beam has passed through the interactive structure.

20. The interaction structure of claim 19, further comprising:

a second integral coupling and bunching section portion of the interaction structure with a second tuner having a portion adjustably extending into a second wave channel of the second integral coupling and bunching section and interacting with electromagnetic fields in the second wave channel to tune the resonant frequency of the interaction structure.

* * * * *